(12) United States Patent
Aurola

(10) Patent No.: US 7,816,653 B2
(45) Date of Patent: Oct. 19, 2010

(54) SEMICONDUCTOR RADIATION DETECTOR WITH A MODIFIED INTERNAL GATE STRUCTURE

(76) Inventor: Artto Aurola, Otakallio 1 A 7, FI-02150 Espoo (FI)

( * ) Notice: Subject to any disclaimer, the term of this patent is extended or adjusted under 35 U.S.C. 154(b) by 636 days.

(21) Appl. No.: 11/660,562

(22) PCT Filed: Aug. 22, 2005

(86) PCT No.: PCT/FI2005/000359

§ 371 (c)(1),
(2), (4) Date: Feb. 16, 2007

(87) PCT Pub. No.: WO2006/018477

PCT Pub. Date: Feb. 23, 2006

(65) Prior Publication Data

US 2010/0133441 A1    Jun. 3, 2010

(30) Foreign Application Priority Data

Aug. 20, 2004  (WO) ................. PCT/FI2004/000492
Nov. 17, 2004  (FI)  ................................. 20041479

(51) Int. Cl.
*G01T 1/24* (2006.01)
(52) U.S. Cl. ................................. 250/370.14
(58) Field of Classification Search ................
250/370.01–370.15, 258; 378/98.8; 257/E31.075, 257/E31.078, E31.081, E31.084, E27.153, 257/E27.154, E27.159, E27.16, E27.163, 257/E29.234, E29.233, E29.235, 414, 428–466; 438/142, 144, FOR. 213, 75, 60, 78, 79, 146; 427/53
See application file for complete search history.

(56) References Cited

U.S. PATENT DOCUMENTS

| | | | |
|---|---|---|---|
| 4,053,335 A * | 10/1977 | Hu | 438/143 |
| 5,670,817 A | 9/1997 | Robinson | |
| 5,712,498 A | 1/1998 | Reich | |
| 5,786,609 A | 7/1998 | Kemmer et al. | |
| 6,025,585 A * | 2/2000 | Holland | 250/208.1 |
| 6,259,085 B1 * | 7/2001 | Holland | 250/208.1 |
| 6,586,789 B1 | 7/2003 | Zhao | |
| 7,256,386 B2 * | 8/2007 | Carlson et al. | 250/214.1 |
| 2002/0139970 A1 | 10/2002 | Iwanczyk et al. | |

FOREIGN PATENT DOCUMENTS

| | | |
|---|---|---|
| EP | 0383389 | 8/1990 |
| EP | 1081766 | 3/2001 |

* cited by examiner

*Primary Examiner*—Davis P Porta
*Assistant Examiner*—Kiho Kim
(74) *Attorney, Agent, or Firm*—Wood, Philips, Katz, Clark & Mortimer

(57) ABSTRACT

A semiconductor radiation detector device comprises a conductive backside layer (102) of first conductivity type and a bulk layer (103). Opposite to the conductive backside layer (102) there are a modified internal gate layer (104) of second conductivity type, a barrier layer (105) of the first conductivity type and pixel dopings (110, 112, 506, 510, 512) of the second conductivity type. The pixel dopings are adapted to be coupled to a pixel voltage, which is defined as a potential difference to a potential of the conductive backside layer (102), and which creates potential minima inside the detector material for trapping the signal charges.

27 Claims, 28 Drawing Sheets

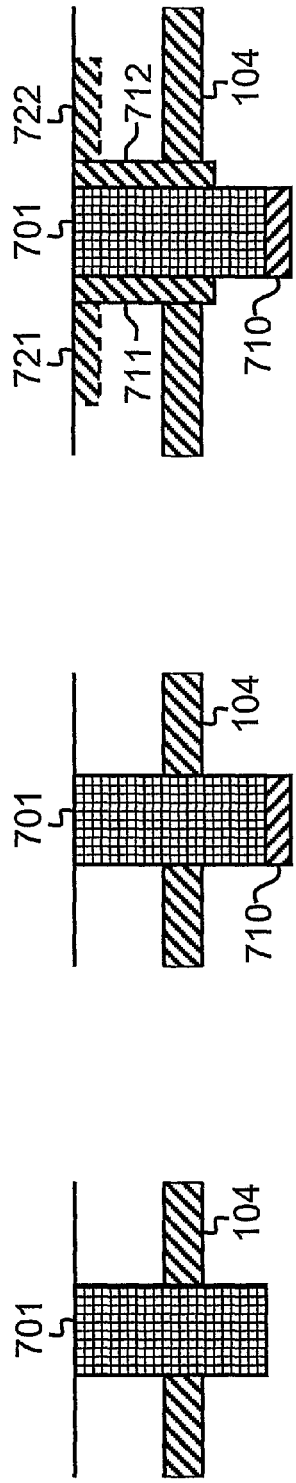
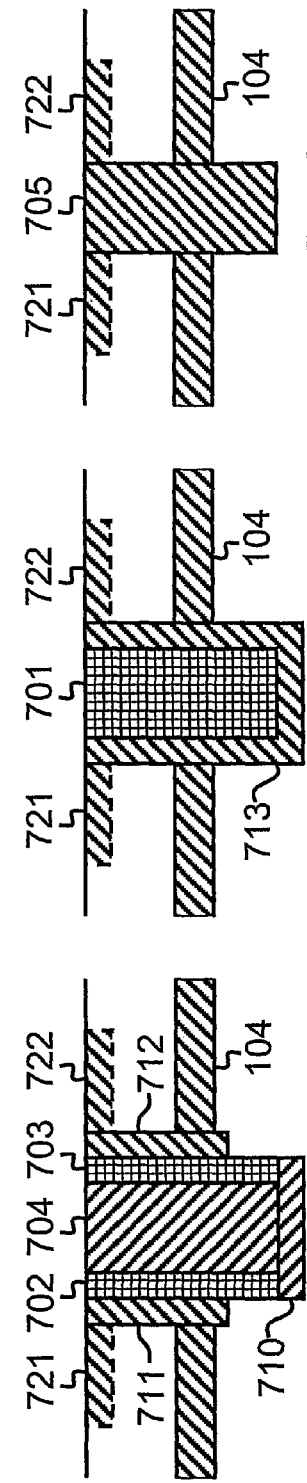
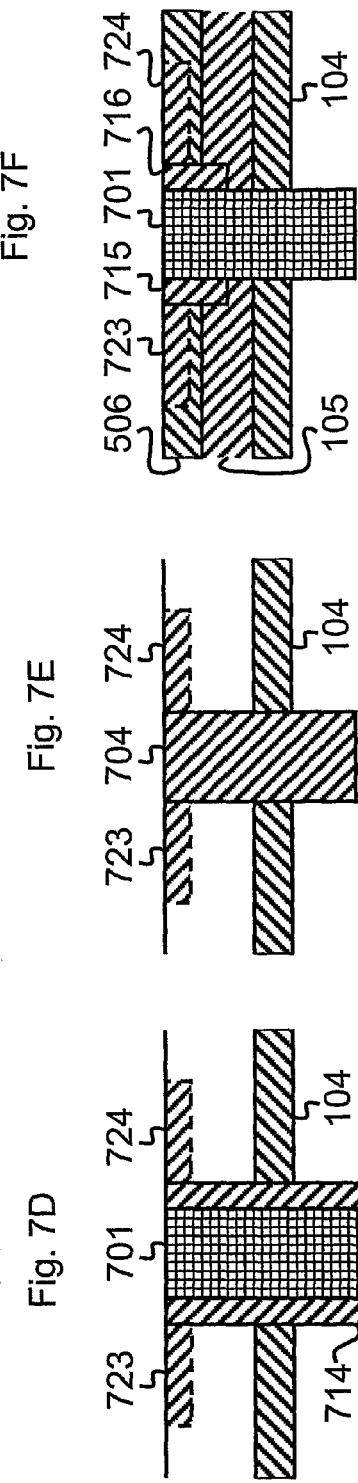

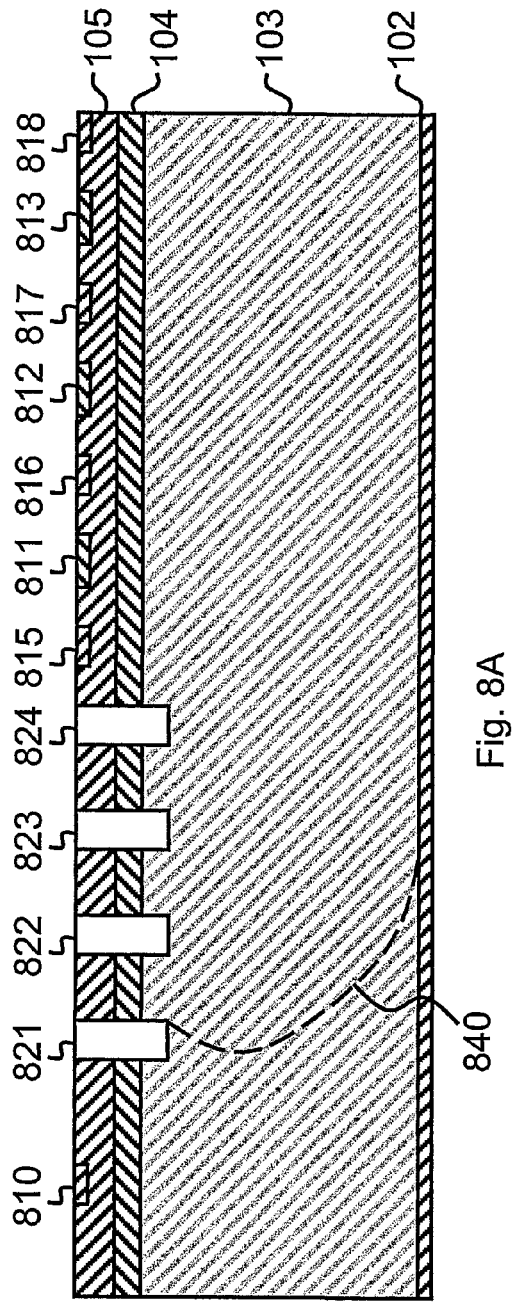
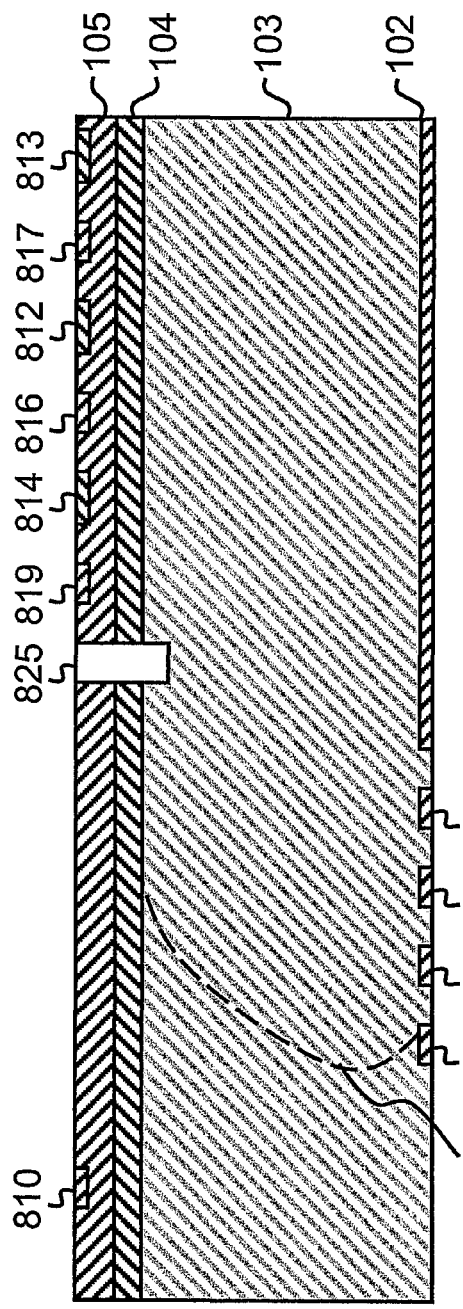

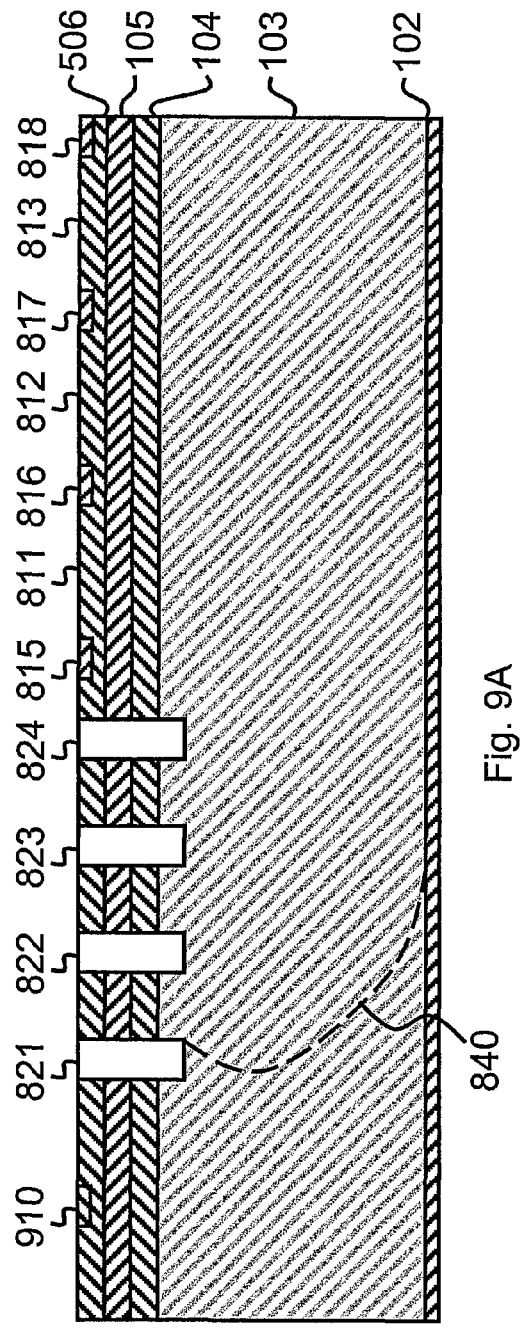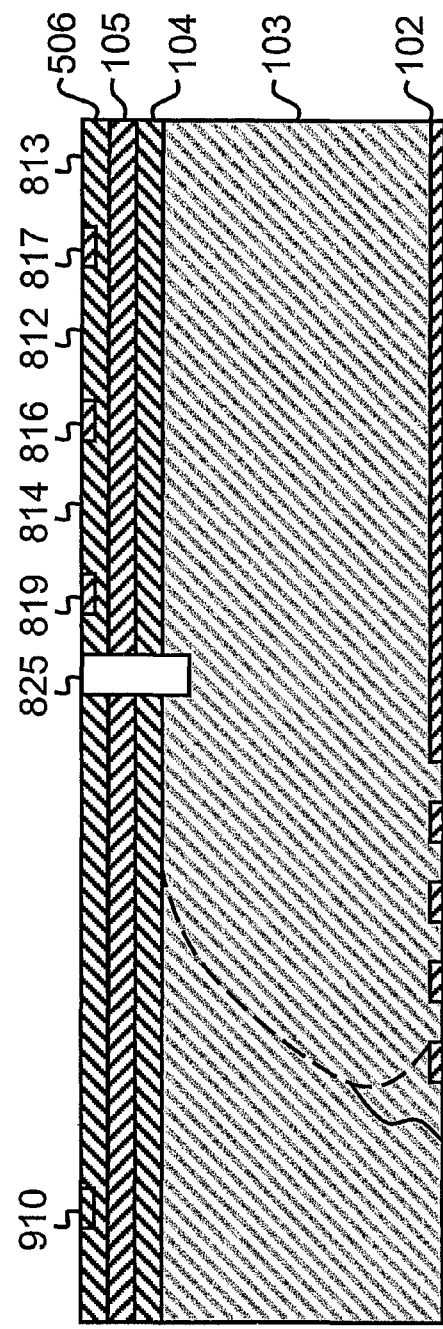

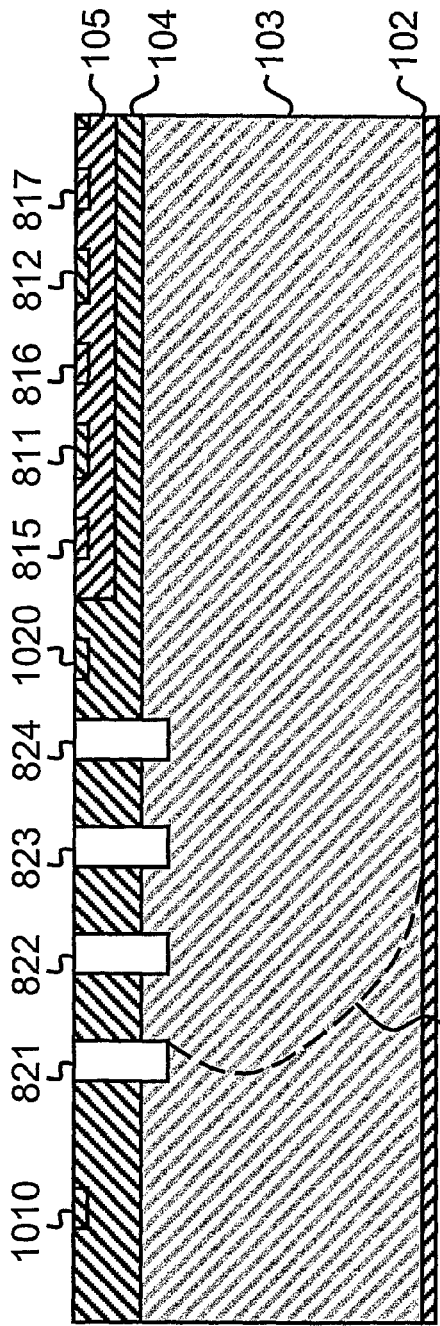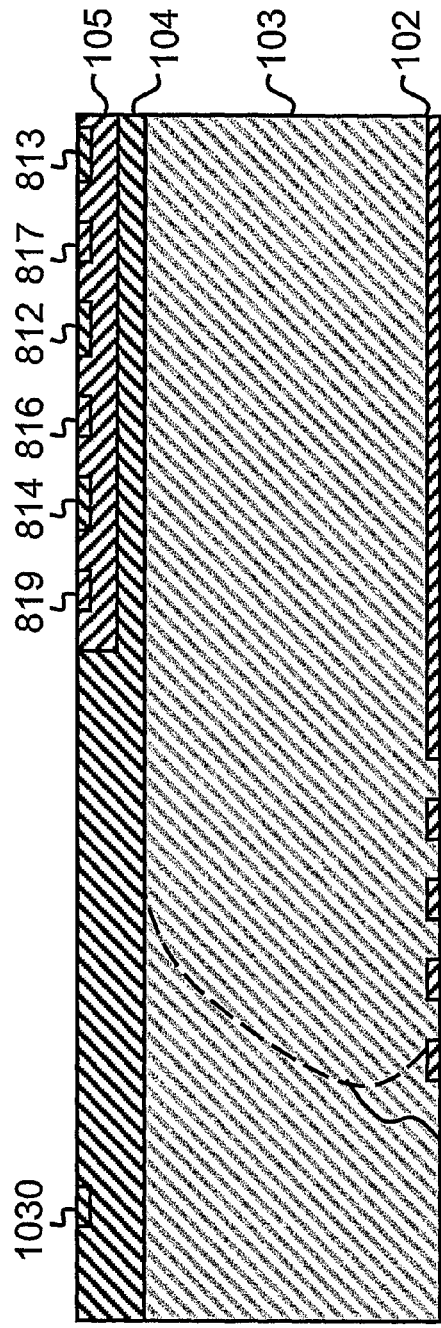

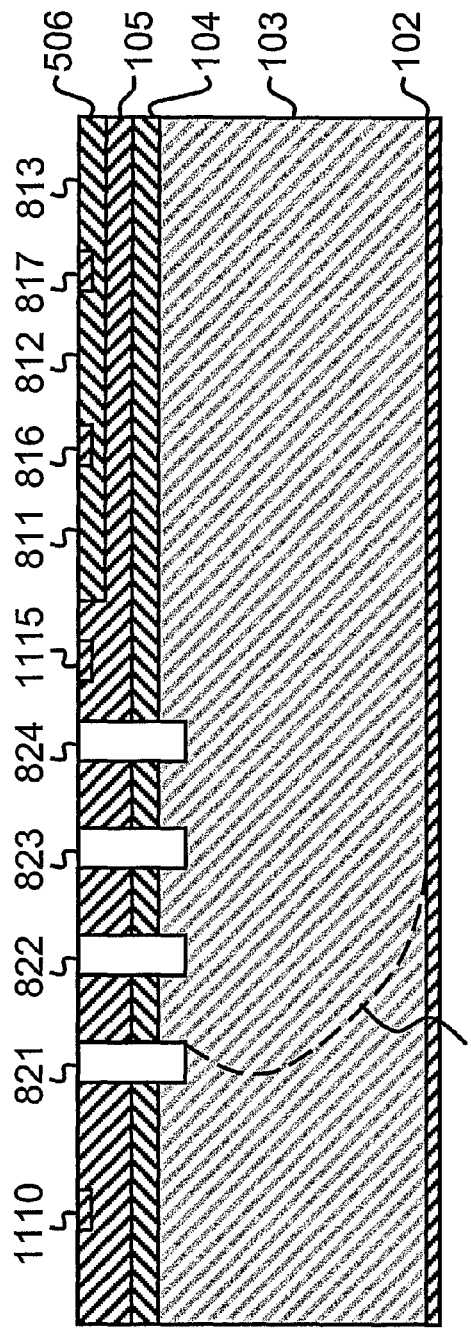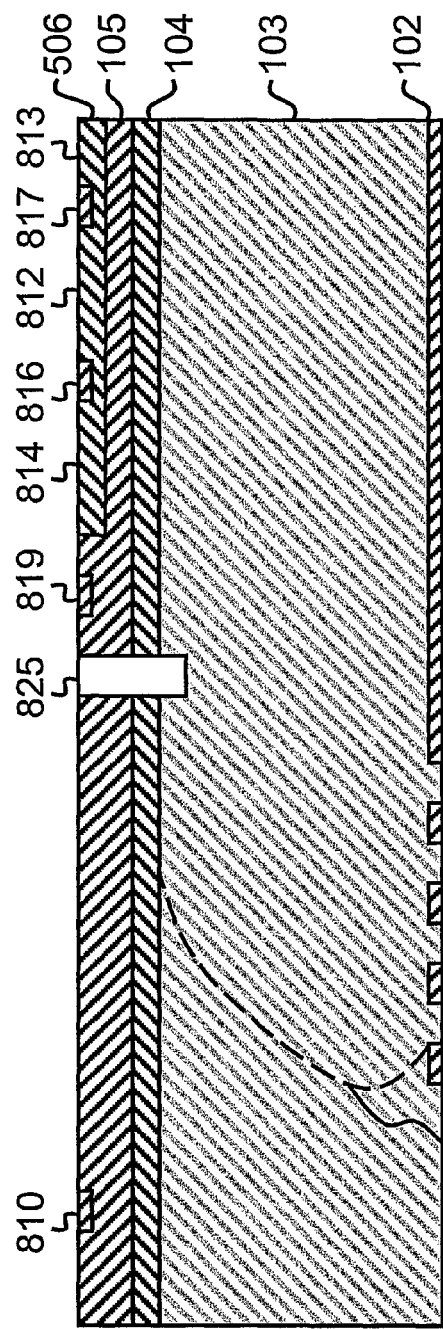

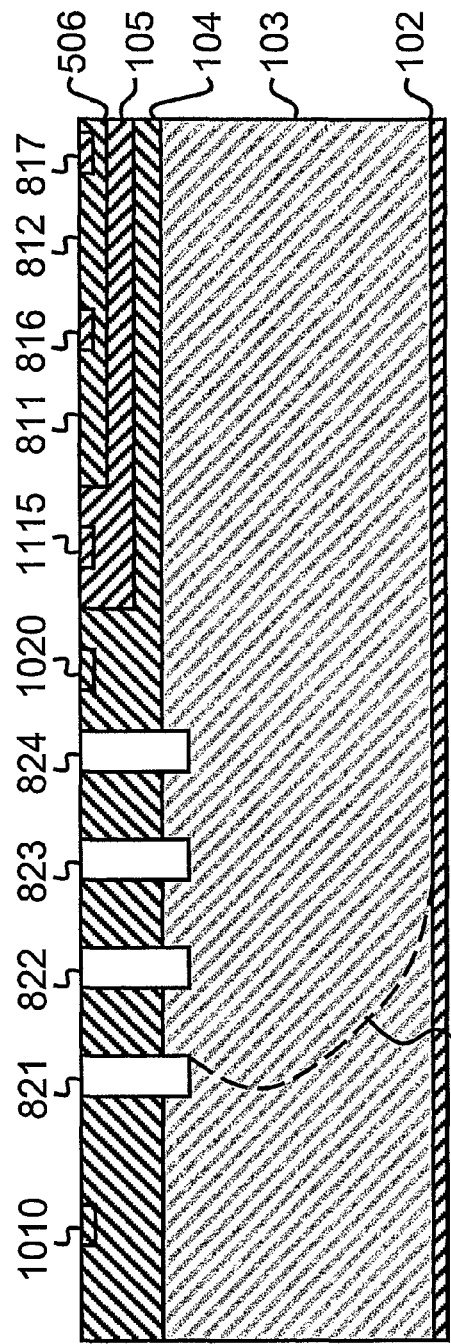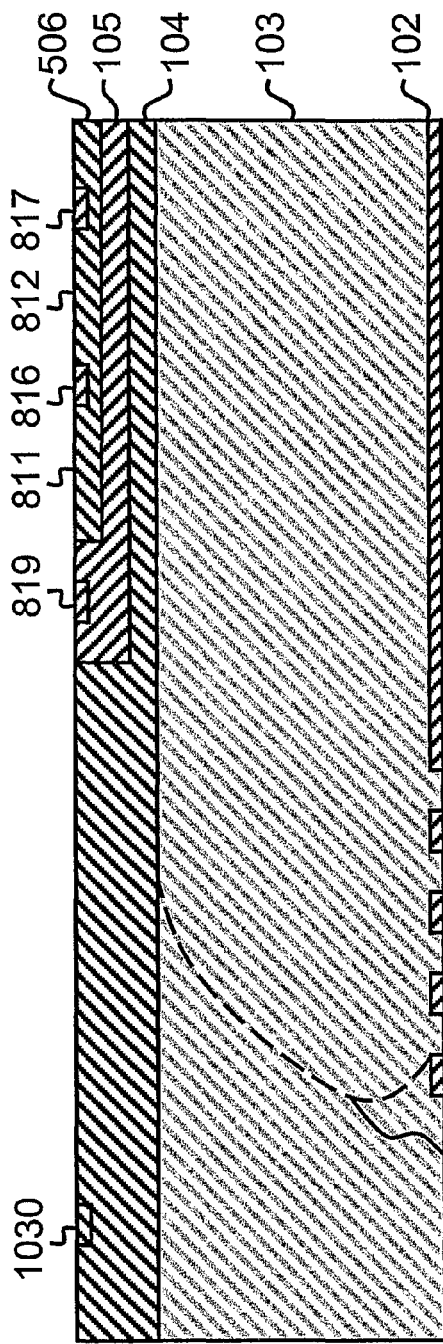

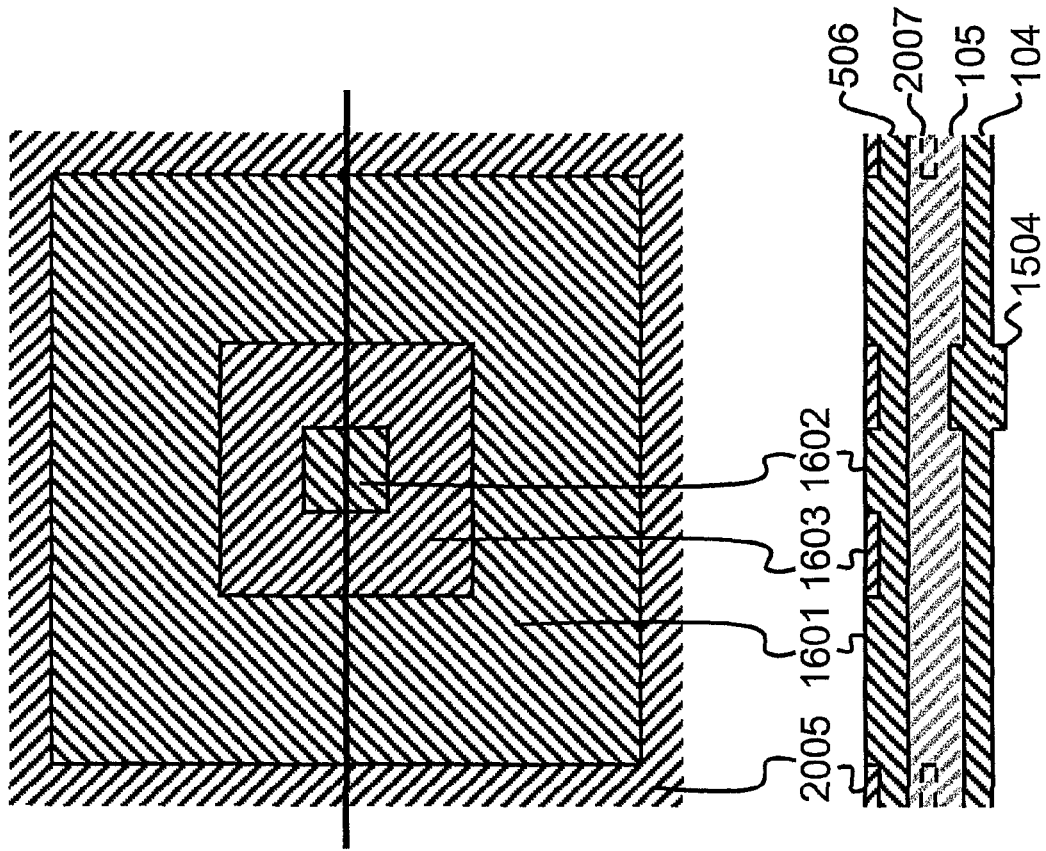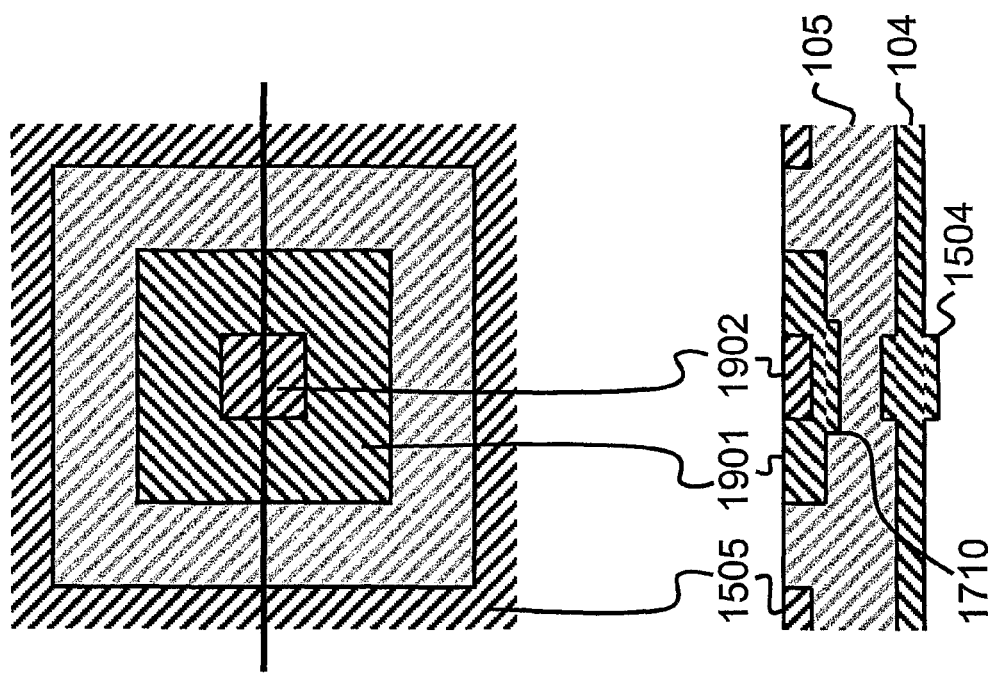

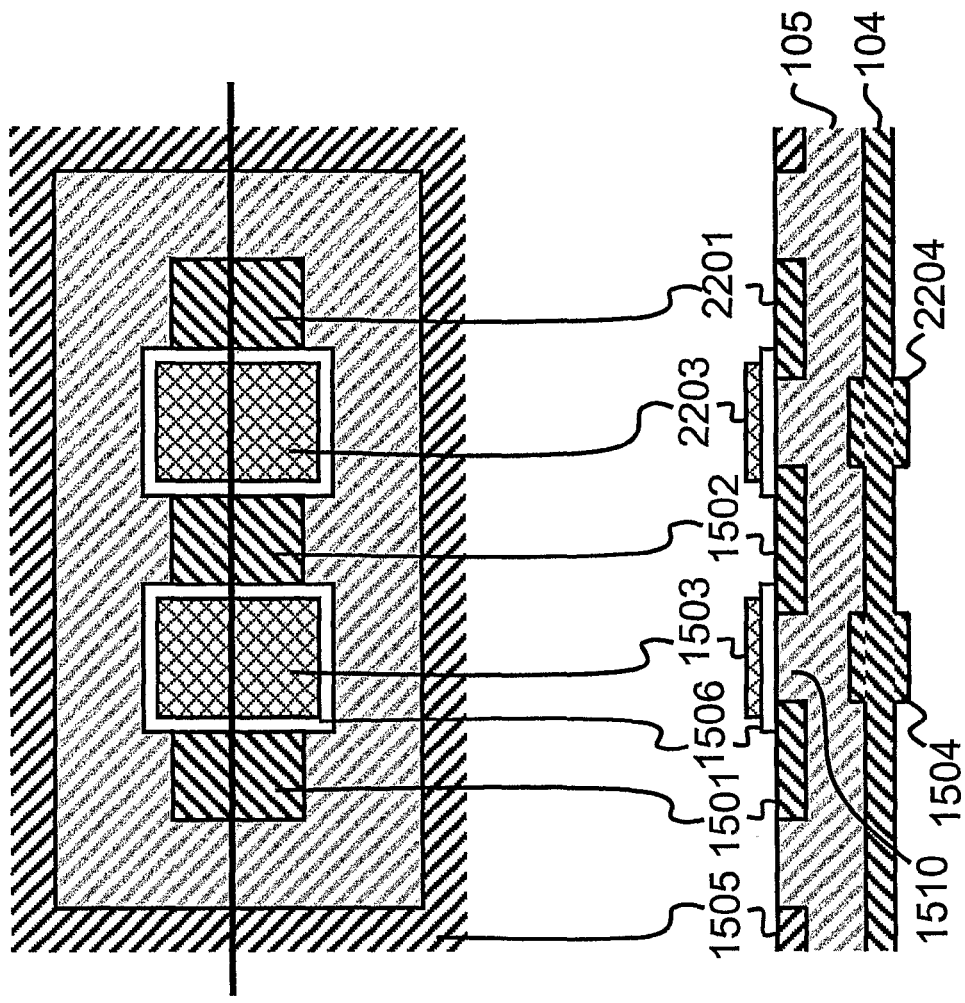
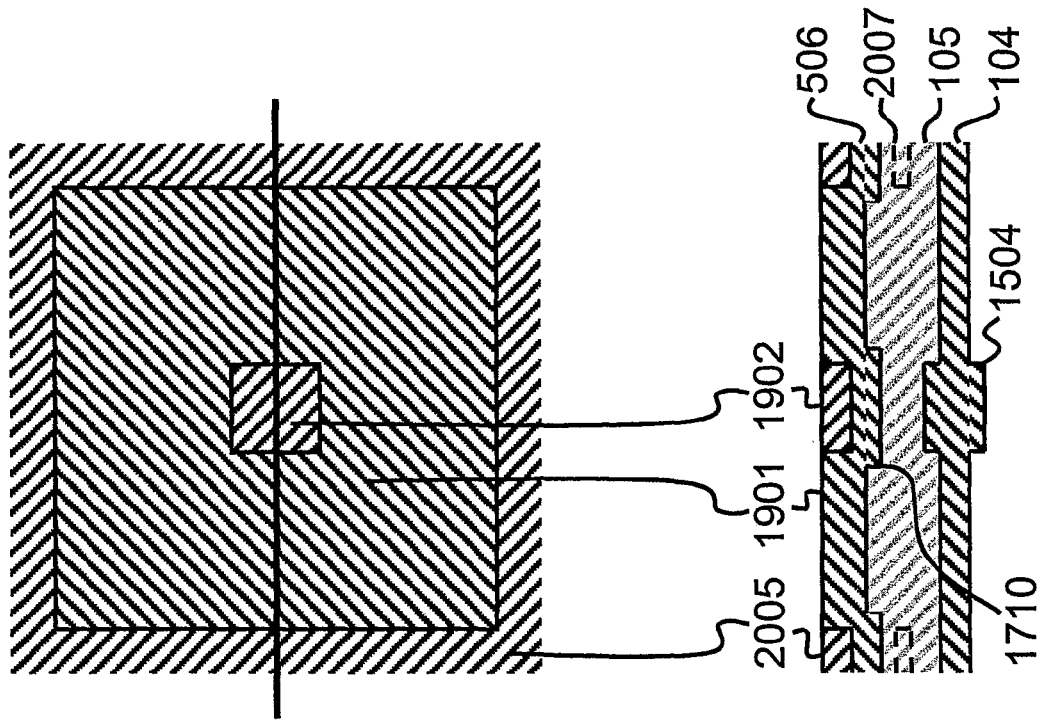
Fig. 22
Fig. 21

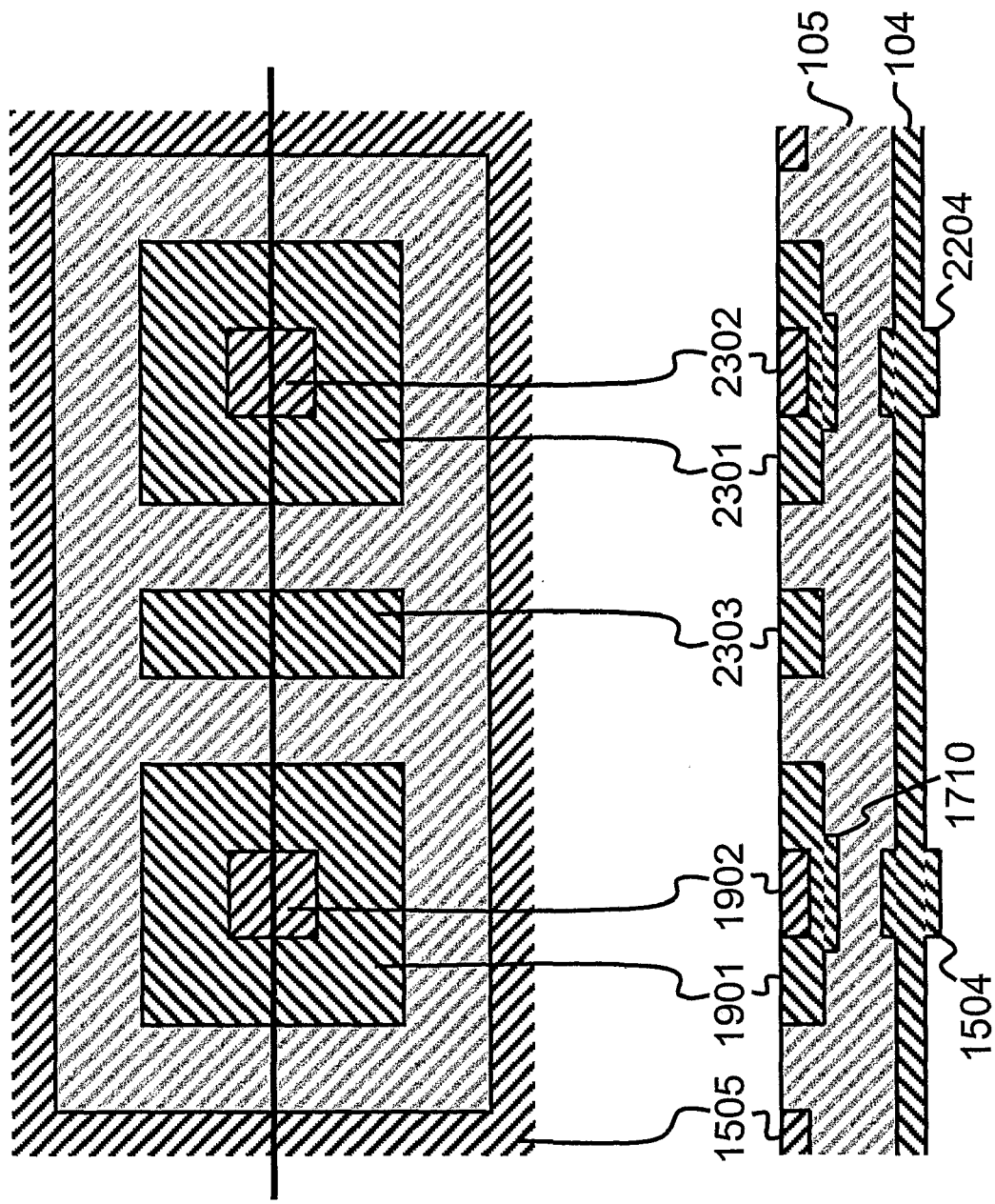

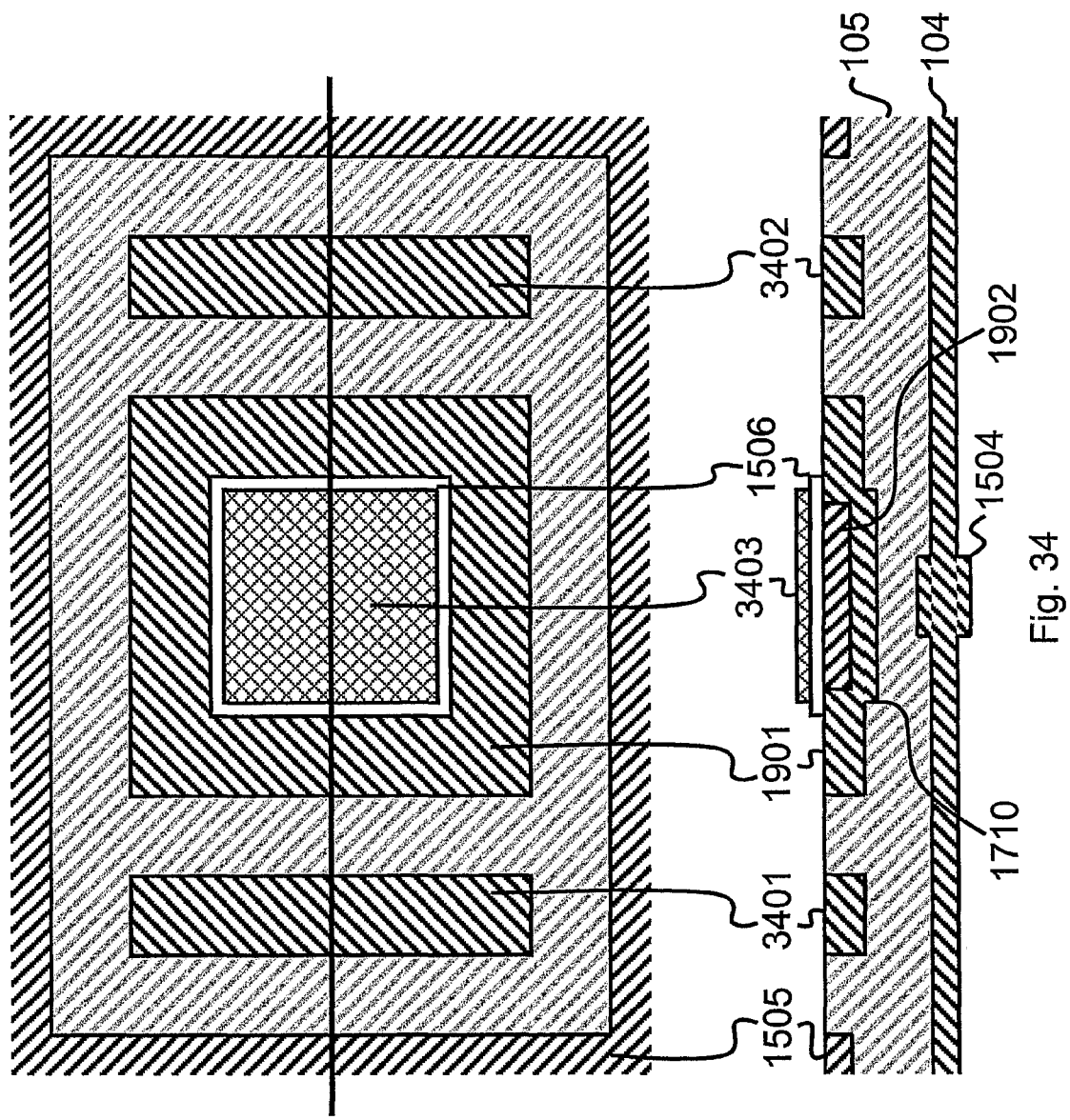

SEMICONDUCTOR RADIATION DETECTOR WITH A MODIFIED INTERNAL GATE STRUCTURE

TECHNICAL FIELD

This invention concerns generally the technology of semiconductor radiation detectors. Especially the invention concerns the way in which the differently doped semiconductor regions are arranged with respect to each other in the detector, and how their electric potentials are handled, in order to maximise the performance of a semiconductor radiation detector.

BACKGROUND OF THE INVENTION

The operation principle of semiconductor radiation detectors is based on a reverse biased pn-junction, creating a so-called depleted semiconductor volume, where an electric field is present. An incident photon (or a particle, such as alfa or beta particle or proton) causes a photoelectric effect, locally creating electron/hole pairs. The electric field of the depleted region segregates the charge carriers, one type of which is used as the signal charge. The measured amount of signal charge is used to determine the intensity of the radiation.

A known semiconductor radiation detector is the CCD (charge-coupled device), which can also be characterised as a charge transfer device (CTD), meaning that charge is transferred possibly long distances before it is measured. The early CCDs were of surface channel type devices, meaning that charge is transported at the silicon silicon-dioxide interface. The interface has, however, plenty of surface defects trapping the charge to be transported, thus decreasing the charge transport efficiency. A major improvement to the performance of CCDs was the transition to buried channel CCDs, where the signal charge is transported in a channel below the surface.

In front illuminated devices, where incident radiation comes through the charge transfer gates (usually made of polysilicon), the gate and isolation materials absorb a part of the radiation. The absorption is particularly intense for blue light, ultra violet (UV) and soft X-ray radiation and for low energy particles, impairing the so-called blue response of a radiation detector. An obvious way to improve the blue response is to use back illuminated devices, where all charge manipulating circuitry, i.e. thick material layers insensitive to radiation, are on the front side of the device.

The neutral substrate at the backside of traditional back illuminated CCDs must be etched away in order to obtain a good blue response, making these devices very thin: typically around 50 µm or less. The thinning process is difficult and likely to result in low manufacturing yield. The thin substrate causes also other problems. The penetration depth of red and near infrared photons in silicon is easily greater than the substrate thickness, resulting in bad red response and fringing, i.e. wavelike patterns in an image. The introduction of a thin biased backside layer, described e.g. in U.S. Pat. No. 6,025,585 and U.S. Pat. No. 6,259,085, combined with a high resistivity substrate, enabled the use of thick fully depleted substrates in back illuminated CCDs resulting both good red and blue response.

Blooming is an interfering effect that takes place when a bright spot in an image results enough of signal charge to fill the charge collection well of the corresponding pixel and starts to fill neighbouring pixels. This phenomenon can be prevented by the use of antiblooming structures. The fully depleted back illuminated CCD presented in U.S. Pat. No. 6,259,085 lacks, however, such antiblooming structures. Smearing is another problem observed during the charge transportation phase when a bright spot adds charge to all charge packets transported through it.

One additional problem in U.S. Pat. No. 6,259,085 and generally in CCDs is that the whole image frame has to be transported and read, even if only a fraction of the image would be of interest, making the operation of CCDs inflexible and slow. These problems are not present in active pixel sensors (APS), where the pixels can be read randomly and the signal charge is not transported, making them fast, flexible and immune to smear. Defective pixels on APS detectors will not affect other pixels unlike in CCDs, which increases fabrication yield and lowers production cost. The image quality can, however, be poor unless a high quality amplifier is attached in every pixel. The best way to accomplish the amplifier is to use the collected charge as an internal gate of a unipolar transistor like junction field effect transistor (JFET) or metal oxide semiconductor FET (MOSFET). From these transistors JFET is favoured. The internal gate structure consists of a potential energy minimum for the signal charges underneath the channel of a FET. The signal charges gathered in the potential energy minimum widen the channel, thus decreasing the channel resistance. The good amplifier properties of an internal gate FET are related to its small total capacitance to its small parasitic capacitance to total capacitance ratio and to the non-destructive reading allowing the signal charge to be read many times.

A good example of an internal gate structure is presented in U.S. Pat. No. 5,712,498 (where the internal gate is called the gate and the actual gate is called the back gate). In this patent a JFET structure is presented upon a buried channel forming the internal gate. The JFET source and drain areas are additionally oxide isolated from the semiconductor wafer. This amplifier structure is preferably used as an APS device but can equally well be used in a CCD structure. The device is back illuminated and must be thinned in order to achieve a good blue response. The red response is bad due to the thin nature of the device. Another prior art U.S. Pat. No. 5,786,609 presents a back illuminated APS radiation detector having a JFET equipped with an internal gate structure and a thick fully depleted substrate. The device has thus both a good red and blue response. In addition to that it has 100% fill factor.

The ultimate performance limit for semiconductor radiation detectors is set by the leakage or dark current, which mixes with the signal charge distorting the signal measurement. The leakage current can be divided to three components. One component arises from depleted regions in the device. Since operation of semiconductor detectors is based on the depletion region, this current component cannot be eliminated. Reducing the depletion region size decreases this current component, but on the other hand this degrades the sensitivity for deeply penetrating radiation. The only reasonable way to minimise this current component is to minimise the amount of defects in the semiconducting material, i.e. one should use high quality substrates and carefully selected manufacturing processes.

A second leakage current component is the diffusion current arising from depletion region boundaries. This component is, however, only significant at depletion regions borders in high resistance material. In fully depleted detectors made of highly resistive material this is the case only outside the active area, i.e. outside the area where the pixels are situated. This current component can be easily eliminated for instance by surrounding the active area with a biased guard ring.

The third and usually most prominent source of leakage current is the interface current, also known as the surface generation current. This current component arises from depleted areas in the semiconductor next to the semiconductor surface or interfaces with different materials, and is referred to later on in the text as surface current.

The reason why surface current forms such a big portion of the total leakage current is due to the fact that the density of defects is high at surfaces and interfaces. Silicon has been widely used as a detector material since high quality substrates are easily available and since the silicon to silicon dioxide interface has a relatively low amount of defects. Even in silicon based detector structures the surface current is usually a major source of leakage current. In U.S. Pat. No. 6,259,085 for instance surface current is the main source of leakage, although the device is operated in multi pinned phase (MPP) state during the charge integration phase. The MPP mode is used to eliminate the surface current during the charge integration period, but it cannot be used during the charge transport period. The structure in U.S. Pat. No. 6,259,085 illustrates well the problematic nature of leakage current; it has a thick fully depleted silicon substrate, MPP operation is used during charge integration period, and surface current is still the major source of leakage.

A well-known way for decreasing leakage current is efficient cooling. However, this requires either complicated liquid gas cooling arrangements or power-intensive peltier element cooling, neither of which is particularly attractive for use e.g. in portable appliances, where both complicatedness and power consumption should be kept at minimum.

Weaknesses of the structure in U.S. Pat. No. 5,712,498 come from the fact that there is no antiblooming structure and that the surface generated charges are not separated from the signal charges. The structure of the later versions of this DEPFET device suggest, however, that the surface generated charges can be collected by a clear contact (marked as L in the patent). Even though the internal gate structure has severe limitations. First of all an exeptionally good homogeneity of the internal gate doping (marked as 1 in the patent) is required. Secondly the use of MOSFET in conjunction with the internal gate structure is problematic since the MOSFET channel has to be always open to prevent surface charges from mixing with the signal charges situated in the internal gate structure. Thirdly the use of a Bipolar transistor in conjunction with the internal gate structure is not possible.

SUMMARY OF THE INVENTION

An objective of the present invention is to provide a semiconductor radiation detector structure, in which the above-explained prior art problems are avoided. An additional objective of the invention is to provide a semiconductor for radiation detector with improved accuracy and reduced susceptibility to leakage current in the measurement. Another objective of the invention is to present an enhanced semiconductor radiation detector structure for measuring the signal charge non-destructively. Yet another object of the present innovation is to provide a vertical antiblooming structure allowing a 100% fill factor.

The objectives of the invention are achieved by a modified internal gate (MIG) structure, which enables isolating the surface current carriers from the signal charge.

A semiconductor radiation detector according to the invention is characterised by the features recited in the characterising part of the independent claim directed to a semiconductor radiation detector.

A method for detecting radiation according to the invention is characterised by the features recited in the characterising part of the independent claim directed to such a method.

An important principle behind the present invention is isolating the signal charge from depleted interfaces, which helps to reach a significant reduction in leakage current. In prior art detector structures, except perhaps the recent DEPFET detectors, the signal charge is not isolated from depleted interface regions, which means that charges generated at some areas of a depleted interface will add to the signal charge. If the signal charge could be totally isolated from depleted interfaces and read non-destructively, one could use more easily different materials than silicon for radiation detectors and the measurement accuracy would improve due to the smaller leakage current.

In the invention such isolation is achieved with a layered structure, in which semiconductor layers or regions of different conductivity types alternate in a suitable way.

The advantages resulting from the surface current isolation may be reaped starting from any of a number of different viewpoints. One possibility is to trade off the improved accuracy with a higher operation temperature of the device, decreasing the need for cooling. This would be of great importance if one could shift from liquid or gas cooling to peltier element cooling, simplifying the detector structure. In germanium, silicon and other indirect band gap materials the photon absorption is based on phonon interaction below certain energy limit. The phonon assisted photon absorption probability is dependent on the phonon density, which is temperature dependent. Thus an increased operation temperature enhances the detectors quantum efficiency for near band gap energy photons, like near infrared photons in silicon. Another important issue is that the interfaces are prone to radiation damage, increasing the surface current of a depleted interface and thus decreasing the lifetime of conventional detectors; isolating the signal charge from the surface current according to the invention helps to avoid this disadvantage.

The exemplary embodiments of the invention presented in this patent application are not to be interpreted to pose limitations to the applicability of the appended claims. The verb "to comprise" is used in this patent application as an open limitation that does not exclude the existence of also unrecited features. The features recited in depending claims are mutually freely combinable unless otherwise explicitly stated.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF DRAWINGS

FIG. 7A illustrates a trench structure,
FIG. 7B illustrates a trench structure,
FIG. 7C illustrates a trench structure,
FIG. 7D illustrates a trench structure,
FIG. 7E illustrates a trench structure,
FIG. 7F illustrates a trench structure,
FIG. 7G illustrates a trench structure,
FIG. 7H illustrates a trench structure,
FIG. 7I illustrates a trench structure,
FIG. 8A illustrates a border of the MIG device,
FIG. 8B illustrates a border of the MIG device,
FIG. 9A illustrates a border of the MIG device,
FIG. 9B illustrates a border of the MIG device,
FIG. 10A illustrates a border of the MIG device,
FIG. 10B illustrates a border of the MIG device,
FIG. 11A illustrates a border of the MIG device,
FIG. 11B illustrates a border of the MIG device,
FIG. 13A illustrates a border of the MIG device,
FIG. 13B illustrates a border of the MIG device,
FIG. 14 illustrates a border of the MIG device,
FIG. 19 illustrates a single pixel MIG device,
FIG. 20 illustrates a single pixel MIG device,
FIG. 21 illustrates a single pixel MIG device,
FIG. 22 illustrates a double pixel MIG device,
FIG. 23 illustrates a double pixel MIG device,
FIG. 34 illustrates a floating emitter MIG device.

LAYERED STRUCTURE AND ELECTRON POTENTIALS

Figure 1:
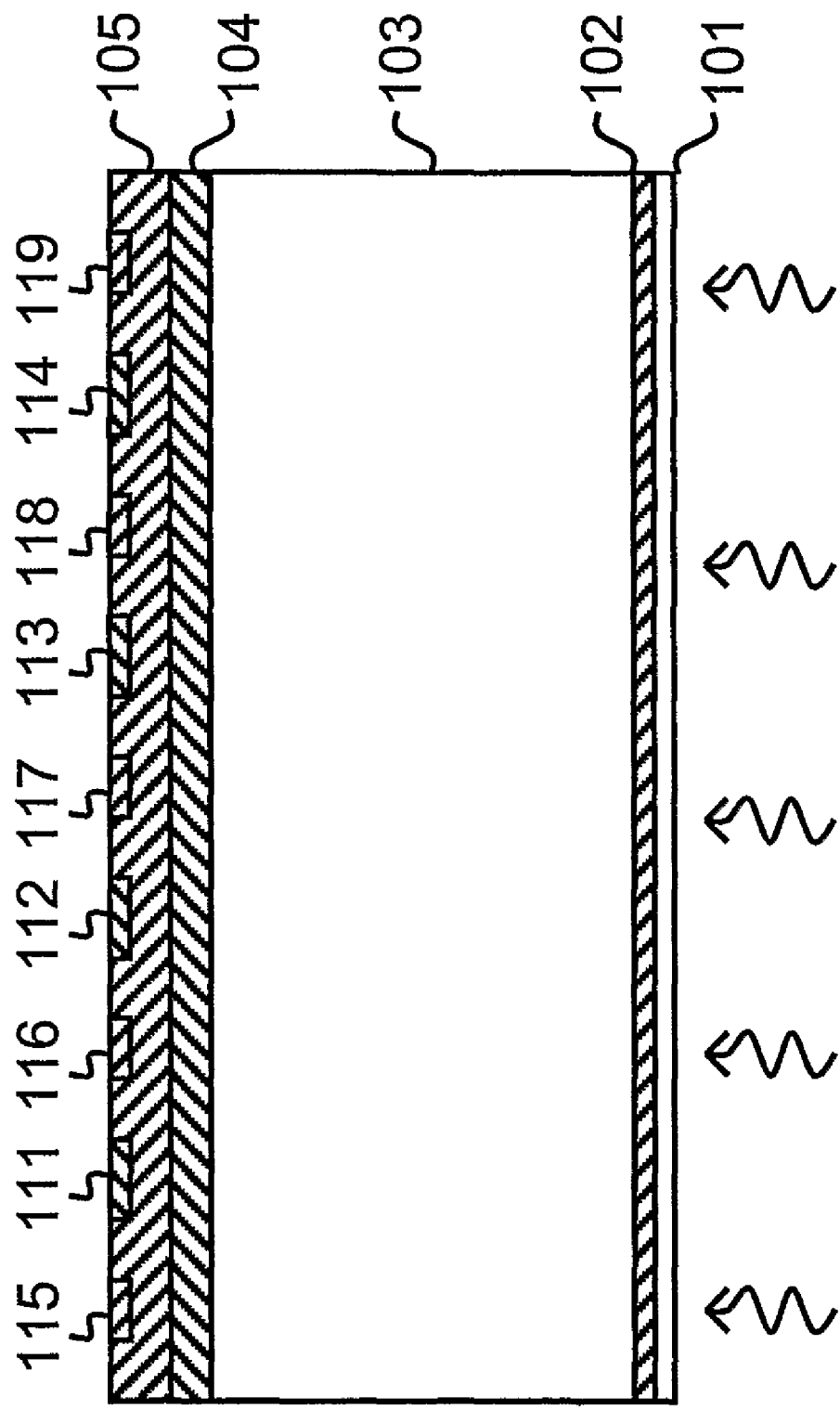
FIG. 1 illustrates a structural principle according to an embodiment of the invention.

FIG. 1 is a schematic cross section of a back-illuminated semiconductor detector. The back surface, through which radiation enters the detector, is downwards in the drawing. From the back surface towards the front surface there may first be an optional antireflection, scintillator or conducting coating 101, the conducting material being for instance metal or transparent conducting oxide (TCO). On top of that is a thin conducting layer 102, which is used to transport the secondary current outside the active area. This layer is formed for instance by doping the back surface of the bulk layer 103 with a first conductivity type dopant. Alternatives to the two layers 101 and 102 have been presented in a co-pending patent application number FI 20040966, the contents of which are incorporated herein by reference.

The bulk layer 103 of the detector is preferably made of a highly resistive (doping concentration around $10^{12}/cm^3$ or less) semiconductor material of a first or second conductivity type. The conductivity types refer here to positively and negatively doped semiconductors, with an excess of positive and negative charges respectively. Further towards the front surface there is a layer 104 of the second conductivity type made for instance by implantation or by epitaxial growth. The layer 104 is in the following referred to as the modified internal gate (MIG) layer. In front of the MIG layer 104 there is again a layer 105 of the first conductivity type, designated here as the barrier layer. The barrier layer 105 can be manufactured using for instance implantation or epitaxial growth. On top of the layer 105 can be protecting insulation layers and conductor layers forming wirings, gates, capacitors and etc.

Patterned, preferably pixel-like implantations 111, 112, 113, 114, having the second conductivity type, are made in the barrier layer 105 and are later referred to as pixel dopings. The area between the pixel dopings, like between 111 and 112, functions as the channel stop isolating the pixels and collecting the secondary charge generated for example at depleted interfaces. Optional floating or biased channel stop implants 115, 116, 117, 118, 119 of first conductivity type can be placed between the pixels.

The electrical potential difference between a pixel doping 111 and a biased backside layer (layer 102 in the structure of FIG. 1) is here referred to as the pixel voltage $V_P$. The location exactly in the middle between the pixel dopings 111 and 112 is referred to as the channel stop location. The electrical potential difference between a channel stop location and the biased backside layer is referred to as the channel stop voltage $V_{CS}$. The electrical potential difference between a front side pixel doping and the biased backside layer 102 during a signal charge clearing phase is the clear voltage $V_C$. The mutual orders of magnitude of these voltages are $|V_C|>|V_P|<|V_{CS}|$.

Figure 2:
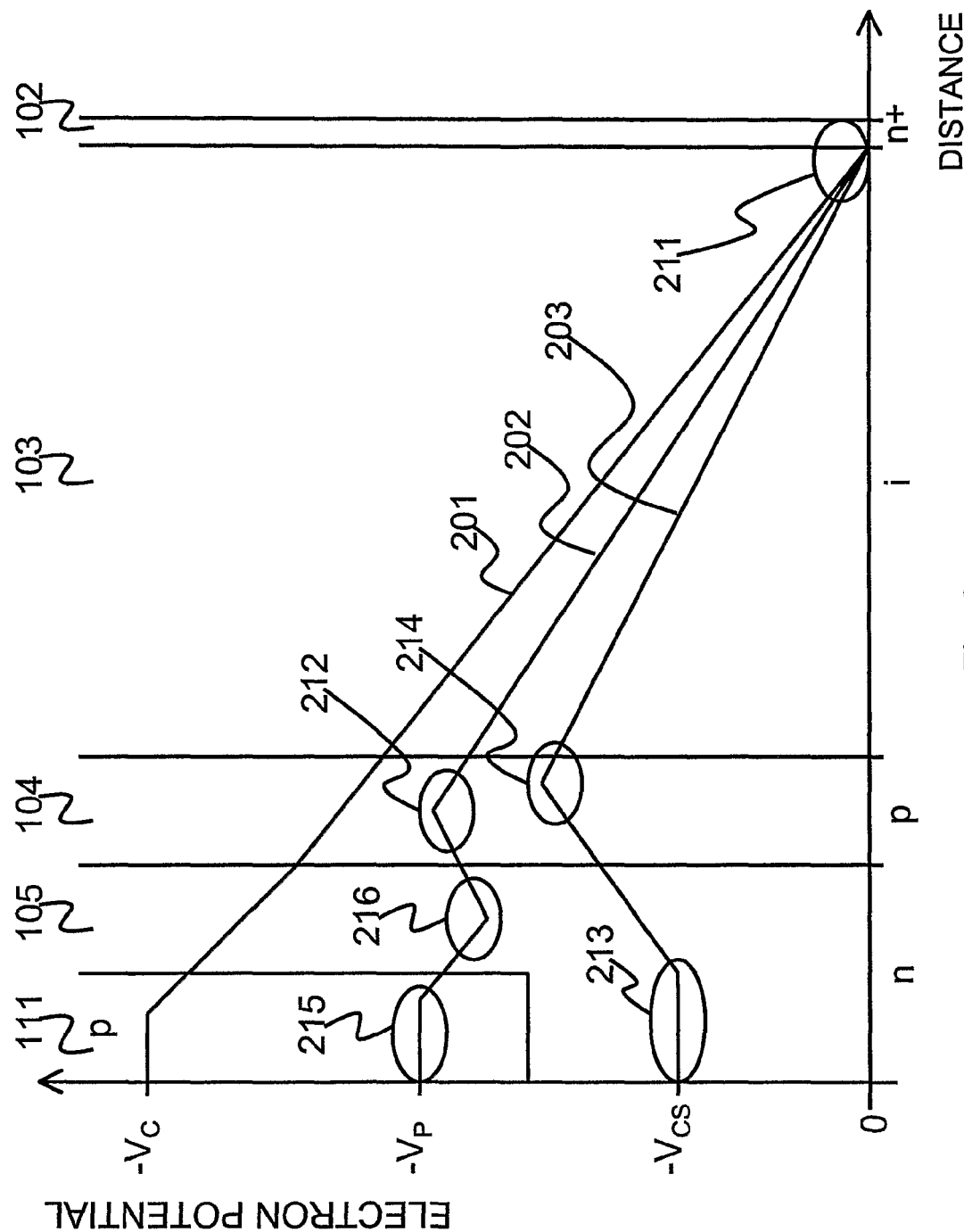
FIG. 2 illustrates electron potentials in a detector using holes as signal charges.

In order to explain the operation of the semiconductor detector of FIG. 1 we will first assume that the backside layer 102 is n+ type that the MIG layer 104 is p type that the barrier layer 105 is n type and that the pixel doping 111 is p type. The bulk layer 103 is made of high resistive semiconductor material of n or p type, i.e. the substrate is almost intrinsic (i). FIG. 2 illustrates potential functions for electrons measured along straight perpendicular front-to-back lines through the layered structure of FIG. 1 at the pixel doping and the channel stop location when different voltages are applied between them and the biased backside layer 102. Flat sections in the potential function correspond to neutral areas and sloping sections correspond to depleted areas. Curve 201 represents the case when the potential difference is $V_C$ between the pixel doping and the biased backside layer. The relatively large negative value of the voltage $V_C$ means that the electron potential is a monotonously falling line from a maximum in the pixel doping to a minimum in the biased backside layer 102. As is shown in the above-referenced co-pending application number FI 20040966, the conductive layer and the optional layer 101 can be replaced with a structure utilising an accumulation layer in the bulk layer 103 very next to said structure, see location 211 in FIG. 2. Concerning details of the formation of an accumulation layer and its utilisation for detector operation reference is made to the co-pending patent application number FI 20040966.

Curve 202 represents the electron potential along a line extending perpendicularly from a pixel doping having a pixel voltage $V_P$ between it and the biased backside layer. The absolute value of $V_P$ is smaller than that of $V_C$, which means that the potential function 202 for electrons is not a monotonously falling line but makes certain bends on the way. A local maximum 215 is found at the pixel doping, from which the potential function falls to a local minimum 216 in the barrier layer 105 (The location 216 is three-dimensional saddle point for both signal and secondary charges). From this local minimum the potential function rises upwards to a local maximum 212 in the MIG layer 104 (the location 212 is a three-dimensional potential energy minimum for signal charges), from which it then falls monotonously to a local minimum at the surface of the conductive layer 102. The respective electron potential function along a perpendicular line extending from a channel stop location to the biased backside layer is represented by curve 203, corresponding to a voltage difference of $V_{CS}$ between a biased or a floating channel stop location and the biased backside layer. In this case the potential function has a local potential minimum 215 in the channel stop location and a potential maximum 214 in the MIG layer 104, from where the function falls monotonously to a local minimum at the surface of the conducting layer 102.

Figure 3:
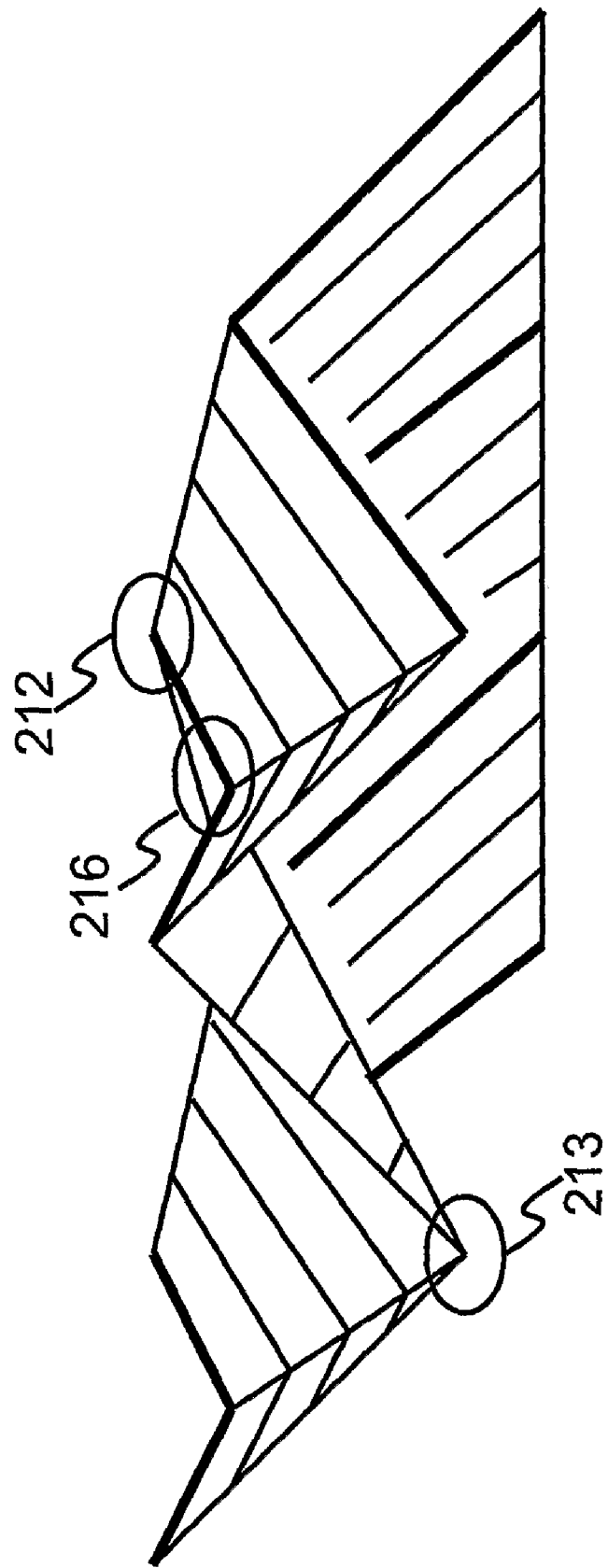
FIG. 3 illustrates electron potential in three-dimensional form.

If we scan the electron potential sideways across the detector, hitting alternately "pixels" (pixel dopings coupled to $V_P$) and "channel stops" (channel stop locations coupled to $V_{CS}$) we get an undulating surface diagram of the kind roughly represented in FIG. 3. The potential lines that correspond exactly to curves 202 and 203 in FIG. 2 are shown with thicker lines in FIG. 3. It is easy to see that there occurs a three-dimensional local potential maximum 212 within the MIG layer corresponding to each pixel, these maxima being sideways separated from each other by the lower potential zones coinciding with the channel stops. Correspondingly there occurs a three-dimensional local potential minimum 213 within the barrier layer 105 corresponding to each channel stop, these minima being sideways separated from each other by the higher potential zones coinciding with the pixels. The three-dimensional saddle point for both signal and secondary charges 216 corresponding to each pixel is also shown in FIG. 3. Since electron potentials are discussed, any mobile electrons within the semiconductor material would prefer moving towards the electron potential minimum locations, while holes would prefer gathering to the maxima of the electron potential, which for holes are naturally minimum potential locations.

When a photon or a charged particle hits the detector, a number of electrons and holes are created in the bulk layer 103. Taken the situation in FIG. 2, the electric field drives electrons towards the back surface of the detector, where they are collected by the conductive backside layer and possible accumulation layer. Holes are driven towards the MIG layer, where they get trapped to locations 212 coinciding with the pixels, due to the behaviour of the electron potential described above. Surface generated electrons that occur at the front surface of the detector, on the other hand, are guided by the channel 216 and get trapped to the electron potential local minima 213 in the barrier layer corresponding to the channel stop locations. The surface generated holes are collected at the electron potential local maxima 215 in the pixel doping respectively. These surface generated holes would normally add to the signal charge. Now the behaviour of the potential inside the detector isolates the surface generated holes from the signal charge, which in this case are the radiation-induced holes trapped to the MIG layer.

Figure 4:
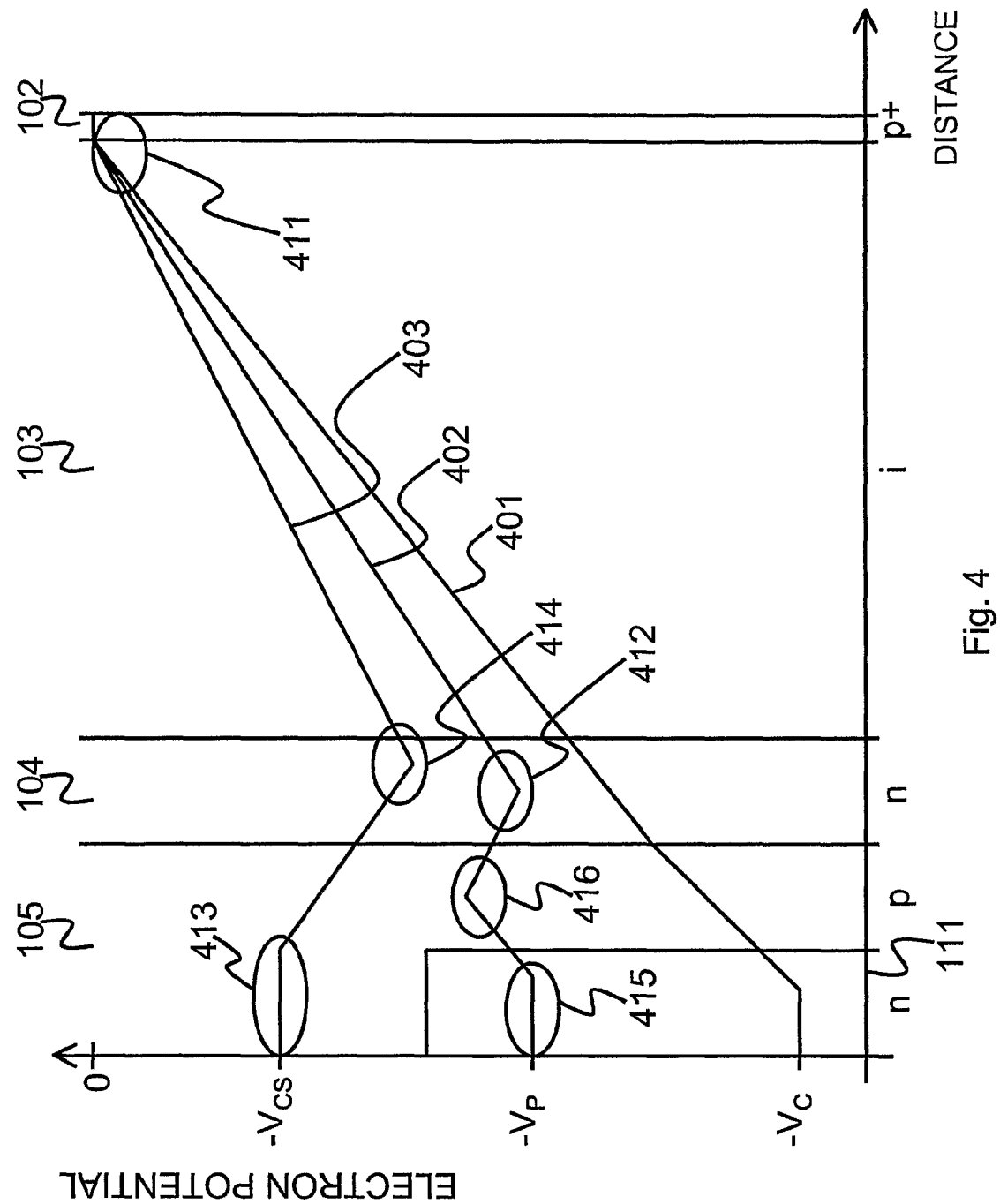
FIG. 4 illustrates electron potentials in a detector using electrons as signal charges.

FIG. 4 illustrates electron potentials in a detector where the layer 102 is of the p+ type the layer 104 is of n type the layer 105 is of the p type and the pixel implant 111 is of the n type. The bulk layer is intrinsic (i). The behaviour of radiation-induced charges is very much similar to that observed in the detector presented in FIG. 2, with the roles of electrons and holes being now reversed. It is the electrons that constitute the signal charge and are collected to electron potential pits that coincide with the pixels, and surface current electrons are kept from interfering with the measurement by collecting them at the pixel doping. The surface current holes are trapped in the barrier layer at channel stop locations. In FIG. 4 curve 401 is the monotonously rising electron potential curve between the pixel dopings and the back surface during signal charge clearing with $V_C$, curve 402 illustrates electron potential at a pixel location ($V_P$) and curve 403 illustrates electron potential at a channel stop location ($V_{CS}$). Radiation-induced electrons are collected at location 412, while surface current holes get trapped at 413 and the surface generated electrons are collected at 415, i.e. at the pixel dopings. 411, 414 and 416 correspond to locations 211, 214 and 216 in FIG. 2.

Figure 5:
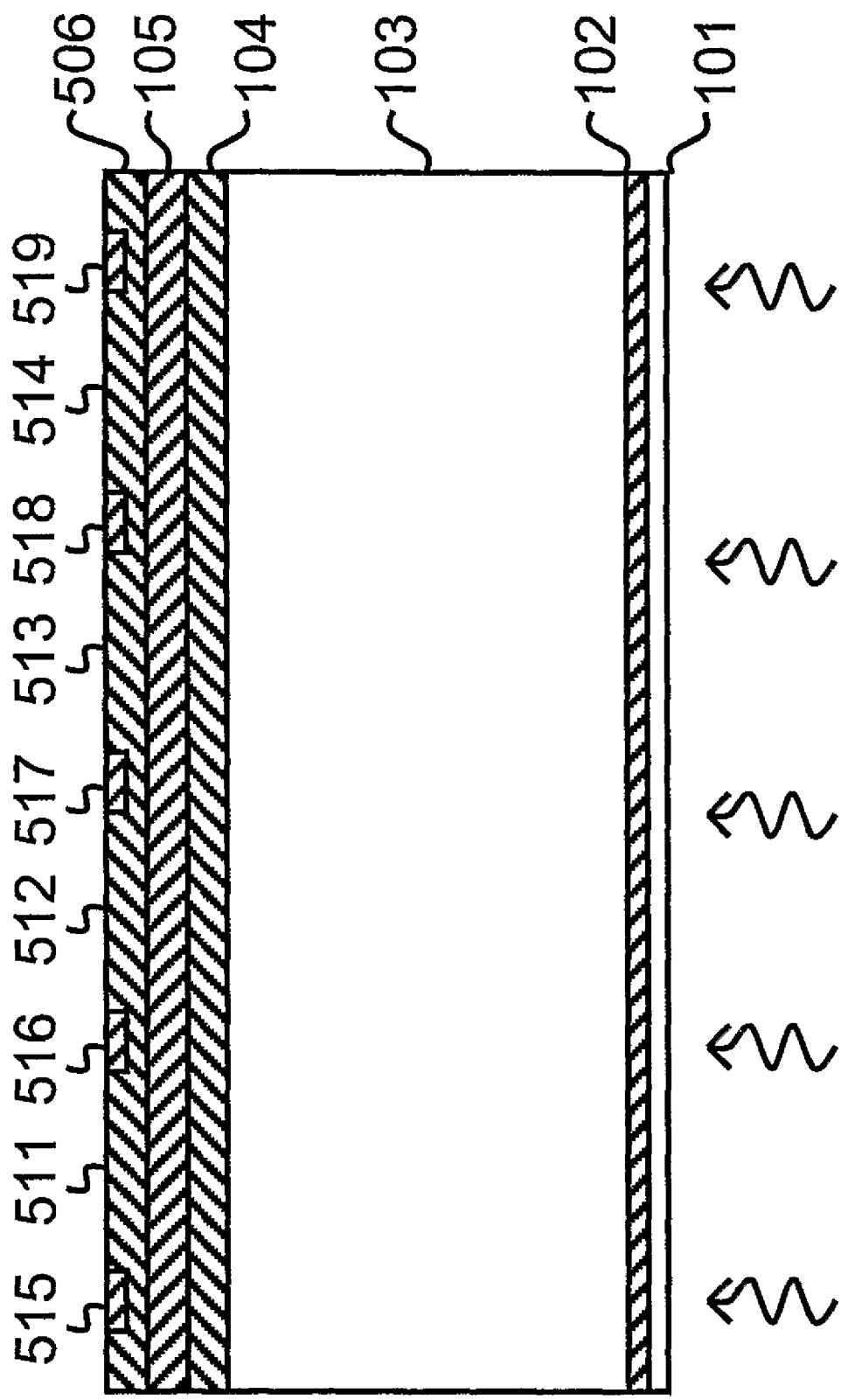
FIG. 5 illustrates an alternative structural principle.

FIG. 5 illustrates an alternative structure, in which the second type pixel layer 506 is made by a blank implantation or by growing an epitaxial layer on top of the barrier layer 105. The pixel dopings 511 and 512 are separated by preferably reverse biased channel stop implants 516 of the first conductivity type, these being inside the pixel layer 506. A channel stop implant 516, referred to later also as a channel stop location, can be the same as the JFET gate or the bipolar emitter implant, which will be introduced later on. The channel stop location 516 is in this case preferably reverse biased in contrast to the pixel doping. If the implant 516 reaches through the layer 506 the situation is essentially the same as in FIG. 1.

Figure 6:
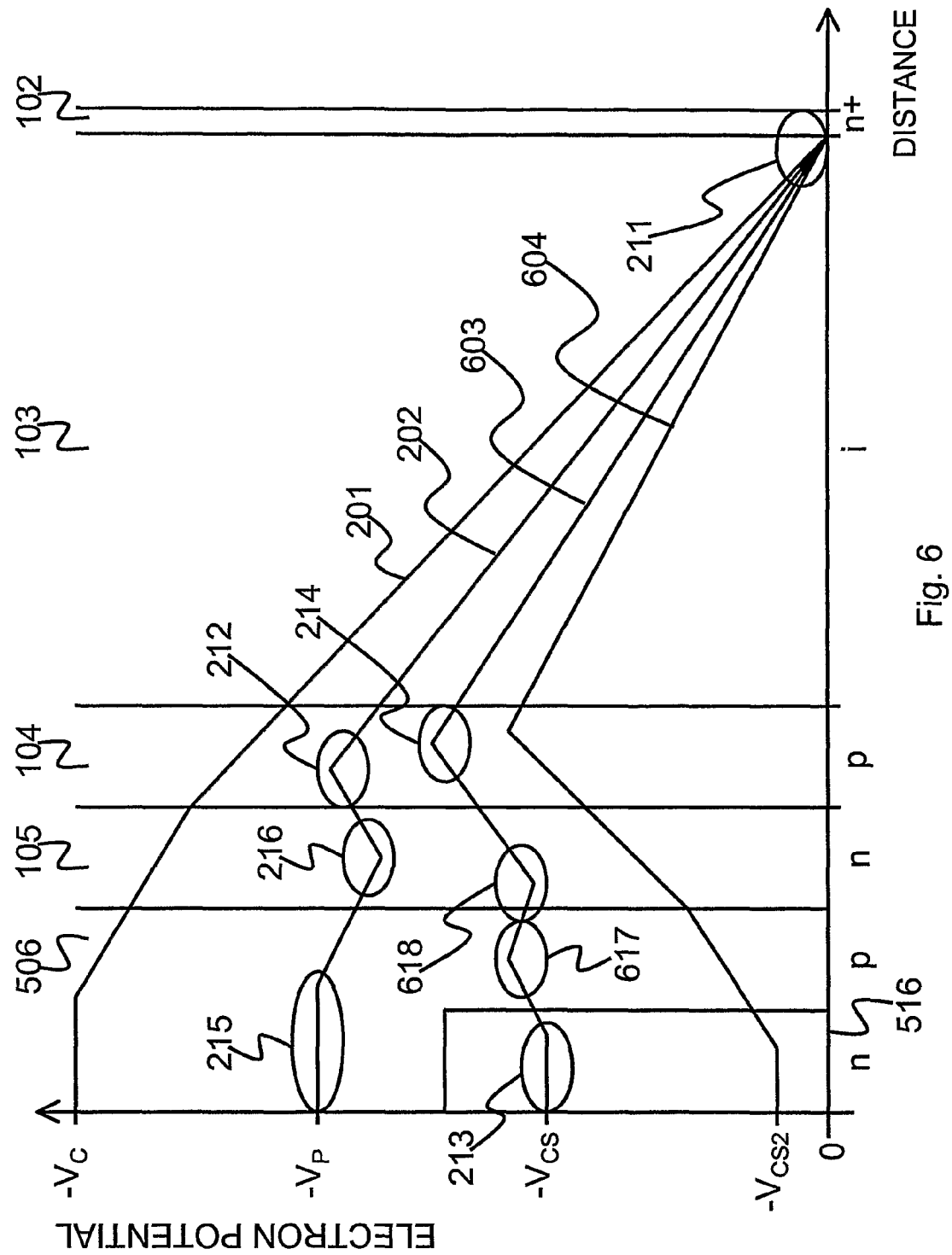
FIG. 6 illustrates electron potentials in a detector using holes as signal charges.

The electron potential functions of the structure in FIG. 5 are presented in FIG. 6. The potential functions 201 and 202 ranging perpendicularly from the pixel dopings 511 and 512 to the biased backside layer 102 represent the cases when the pixel dopings are at clear and pixel potentials respectively. These are identical to FIG. 2. At the channel stop locations the corresponding potential function 603 is different from 203 presented in FIG. 2. In function 603 there is an additional local maximum 617 and an additional local minimum 618. The electron potential local minimum 213 collects the surface generated electrons and the channel 617 guides the surface generated holes to the electron potential local maximum 215 at the pixel doping. The potential function 604 represents a possible channel stop voltage configuration in which the electrons in the potential minimum 618 are drained. This can be done for instance by lowering the absolute magnitude of the voltage difference between the front and backside of the chip. The channel stop voltage can also be set to correspond continuously to the potential function 604.

The borders of the devices in FIGS. 1 and 5 are not shown. The borders should be neutral in order to avoid excessive leakage current generation at the chip edges which would significantly increase the power consumption of the device. The neutral border region can be achieved by using guard structures. Some examples of such structures based on trenches are presented in FIGS. 7A-7H. Only the MIG layer 104 is shown of the layered structures presented in FIGS. 1 and 5. A simple trench structure filled with isolator material 701 is shown in FIG. 7A. In FIG. 7B a doping 710 of the first type is created on the bottom of the trench using a perpendicular implant before filling the trench with isolator material. After this implantation step one could also use a perpendicular or tilted deep implant, i.e. a high energy implant of the second type forming a second type doping below the first type doping 710 (this applies also to structures in FIGS. 7C and 7D). A wet etch may be performed before filling the trench.

A more complicated trench structure is presented in FIG. 7C where the walls of the trench are first doped with a second type of dopant using tilted implant. Then etching is continued and as a result of this second type dopings 711 and 712 are created at the walls of the trench. After the etching process a first type doping 710 is created on the bottom of the trench using a perpendicular implant. Before filling the trench with isolator material 701 a wet etch step may be performed. All these process steps can be performed with a single mask step. The optional first type implants 721 and 722 can be made before or after the trench is done. One should note that if the trench surrounds an area, the MIG layers inside and outside the trench can be at a different potential. The implants 721 and 722 can be used to connect the separated MIG layer parts to different potentials. If the trench is a point like hole the implants 721 and 722 can also be made using a tilted implant.

An even more complicated trench structure is presented in FIG. 7D. The process steps of this structure can be similar than the process steps of the structure in FIG. 7C until the trench filling process. In FIG. 7D a isolator layer is deposited on the walls of the trench. After this the isolator layer at the bottom of the trench is etched away creating the isolation layers 702 and 703. The doping 710 can also be created at this stage. Finally the trench is filled for example with polycrystalline semiconductor material 704 of the first type enabling the biasing of the doping 710. The trench can also be filled with a suitable metal or insulator. All the afore described process steps can be done using only one mask.

Another type of trench structure is presented In FIG. 7E. This structure is created by etching a trench, implanting the walls of the trench by a second type of dopant forming the doping 713. The trench is next filled with an isolator material 701, or with metal or polycrystalline material. The trench structure in FIG. 7F is essentially the same than in FIG. 7E. This structure is created by etching a trench and filling it with polycrystalline material 705 of the second type. The areas 714, 723 and 724 of the trench structure in FIG. 7G correspond to areas 713, 721 and 722 of the trench structure in FIG. 7E with the exception that they are oppositely doped. One can also perform a deep implantation of the second type before or after the implantation of 714. The areas 704, 723 and 724 of the trench structure in FIG. 7H correspond to areas 705, 721 and 723 of the trench structure in FIG. 7F except that they are oppositely doped. Before filling the trench structure in FIG. 7H the trench walls can be implanted with second or first type implant. The trench walls can also implanted with a shallow first type implant and with a deep second type implant. The doped areas 715 and 716 of the first type on the walls of the trench structure presented in FIG. 7I can be made similarly than the doped areas 711 and 712 of the second type in FIG. 7C. The structures 715 and 716 can be used to contact the barrier layer 105. The bottom of the trench can also be doped with a first or second type implant, after which an opposite type deep implant can be performed.

The border of the device shown in FIG. 1 and having a bulk layer 103 of the first type of doping is presented in FIG. 8A. The trench structures 821, 822, 823 and 824 can be for instance of the type presented in FIGS. 7A, 7B, 7C and 7D. A preferably ring like guard structure 811 of the second type doping surrounds the active area containing the pixels 812, 813 and the optional channel stop structures 816, 817, 818. An optional preferably ring like guard structure 815 of the first type doping surrounds the other guard structure 811. The barrier layer at the border of the chip can be contacted through the optional first type doping 810. There can also be contacts to the areas in between the trench structures.

The device in FIG. 8A has the following operation principle. The biasing of the bulk layer 103 and the backside layer 102 can be done from the backside by making a contact to the backside layer 102. The trench structure presented in FIG. 7D can alternatively be used to bias the bulk layer and the backside layer from the front side of the device. The optional doping 810 is also connected to the same potential than the backside layer and the bulk layer. A reverse bias $V_P$ is applied between the second type dopings 811, 812, 813 and the backside layer 102. A reverse bias of the size $\|V_P\|-\|V_{SC}\|$ is possibly applied between the optional first type dopings 815, 816, 817, 818 and the second type dopings 811, 812, 813. The areas 811 and 815 may contain selection and read out electronics and they may be connected to some other potential than to $V_P$ or $V_{SC}$. As a result of the afore explained biasing of the device a depletion region is formed inside the device. Due to the trench structures 821-824 the depletion region boundary 840 does not reach the chip border. The areas between the trench structures 821-822 are preferably floating but can also be biased.

The signal charge in the MIG layer can be emptied by increasing the reverse biasing between the pixel doping and the backside layer. This can be done by altering the voltage of the pixel doping or by altering the voltage of the backside layer 102. The advantage of the former method is that the signal charge in pixels can be cleared individually if necessary. High field values on the front surface are, however, a consequence of the individual clearing process. In the latter method the signal charge of all pixels is cleared at the same time. However, in the latter method the potential of the pixels can be constant at all times (for instance at ground potential) which facilitates the design of the read out and selection electronics. In either method the channel stop voltage can be altered to enhance signal charge clearing.

The bulk layer 103 of the device in FIG. 8B is of the second type of doping. In this case two sided pressing is necessary in order to produce the guard structures 831-834 of the first conductivity type on the backside of the device. Another problem of the device is that the contact to the backside layer has to be wire bonded. Only one trench structure 825 is needed on the front side of the device. This trench structure can be for instance either one presented in FIG. 7E or 7F. The bulk layer can be biased using these trench structures. The doping 819 of the first type is preferably a ring surrounding the active area containing the pixels. The doping 814 of the second type can be a ring surrounding the active area or a pixel. Read out and selection electronics can be situated outside, i.e. on the left side of the trench, and in the dopings 814 and 819. Additional, for example, point like trench structures can also be made on the left side of the trench 825 to improve the contact to the bulk layer.

In operation the neutral part of the bulk layer 103 and the optional doping 810 are at the same potential. A high reverse bias voltage is connected between the backside layer 102 and the neutral part of the bulk layer 103. The guard structures 831-834 are preferably floating but may also be biased. A reverse bias voltage is connected between the doping 819 of the first type and the neutral bulk layer 103. This reverse bias voltage must be high enough to pinch off the channel in the MIG layer 104. The voltage difference between the back layer 102 and all the second type dopings 812-814 is preferably $V_P$ during signal charge integration. The first type dopings 816, 817, 819 are all preferably connected to the channel stop voltage $V_{CS}$ and there exists a reverse bias between them and the second type dopings 812-814. The signal charge is cleared in the same manner than is done in the device shown in FIG. 8A.

The border of the device presented in FIG. 5 and having a bulk layer of the first type of doping is presented in FIG. 9A. The trench structures in this device can be the same than in the device of FIG. 8A. The second type doping 910 is a contact to the second type pixel layer 506. This doping has to be at the same potential than the neutral bulk layer 103. The operation principle of the device in FIG. 9A is already explained in FIG. 6 and it is very similar than the operation principle of the device in FIG. 8A. The border of the device presented in FIG. 5 and having a bulk layer of the second type is presented in FIG. 9B. The trench structures in this device can be the same than the ones in the device of FIG. 8B or one can use the one presented in FIG. 7I. The operation principle is also very similar to the device in FIG. 8B.

The devices presented in FIGS. 10A and 10B correspond to devices of FIGS. 9A and 9B. In the two first mentioned devices the layer 105 is made for instance using a structured implant which requires one mask step. The trenches in FIG. 10A can be for instance of the type presented in FIGS. 7A, 7B and 7D. The structures 711, 712, 721 and 722 are, however, in this case not needed. In FIG. 10A the optional doping 1010 is kept at the same potential than the neutral bulk layer. The optional doping 1030 in FIG. 10B is automatically at the same potential than the neutral bulk. The optional doping 1020 can be floating or biased. If the doping 1020 acts as a biased guard ring the doping 811 can also be a pixel. In this case the doping 1020 could be at pixel potential $V_P$ and it could contain selection and read out electronics. The operation principle of the device is the same than of the device presented in FIG. 8A. In the device of FIG. 10B no trench structures are needed. The operation principles of the devices in FIGS. 8B and 10B are the same.

The devices in FIGS. 11A and 11B correspond to FIGS. 9A and 9B. In the two first mentioned devices the layer 506 is done for instance using a structured implant. The trench structures in FIG. 11A can be the same than in FIGS. 8A and 9A and the trench structure in FIG. 11B can be the same than in FIGS. 8B and 9B. The optional doping 1115 can be floating or biased for instance to the channel stop potential. The doping 1115 can also contain selection and read out electronics.

Figure 12:
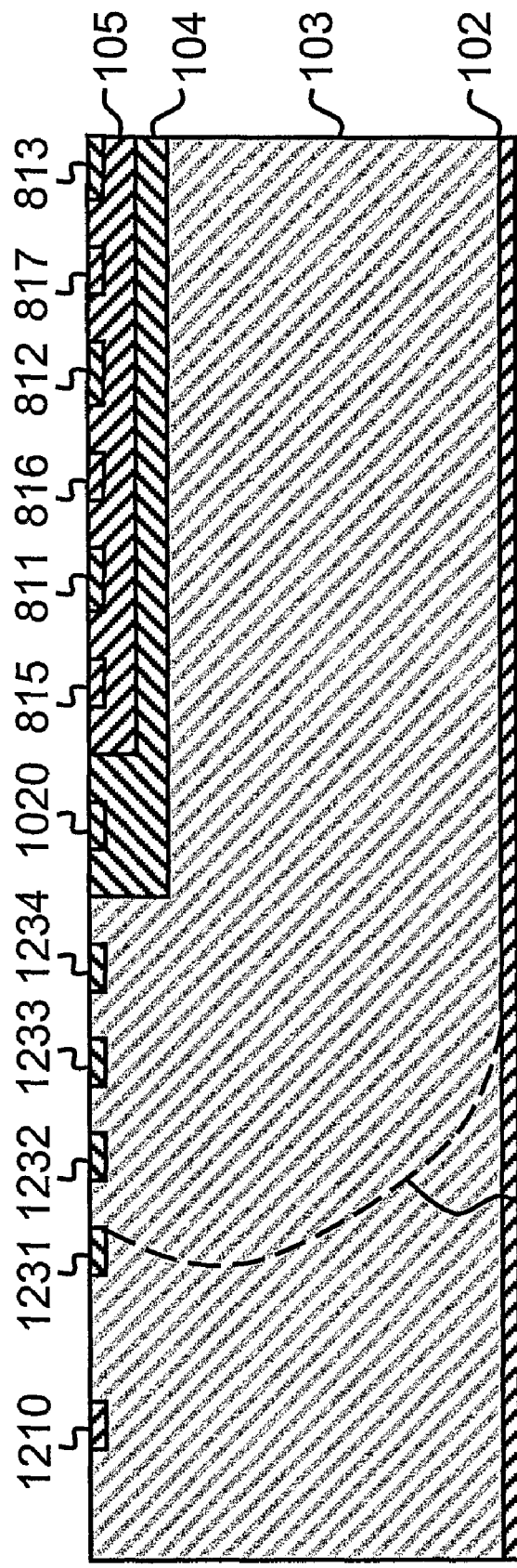
FIG. 12 illustrates a border of the MIG device.

The layers 104 and 105 of the device presented in FIG. 12 are manufactured using for instance two structured implants. The guard structures 1231-1234 are preferably floating but may be biased. In this case no trench structures are needed. In FIGS. 13A and 13B the layers 105 and 506 are manufactured for instance using two structured implants. The layers 104, 105 and 506 of the device presented in FIG. 14 are manufactured for instance using three structured implants. The operation principles of the devices in FIGS. 8A, 9A, 10A, 11A, 12, 13A and 14 is very similar. This is true also for the devices in FIGS. 8B, 9B, 10B, 11B and 13B.

The secondary charges created in the bulk layer 103 are collected by the biased backside layer 102 inside of which they are transported to the border of the device. The doping 1210 and the trench structure 821 can be used as a front side contact to the bulk layer 103 and to the biased backside layer 102 in devices presented by the FIGS. 9A, 10A, 11A, 12, 13A and 14. This contact collects the afore mentioned secondary charges after they have diffused through the neutral bulk. In devices presented by FIGS. 8B, 9B, 10B, 11B and 13B the contact to the biased backside layer 102 collecting the afore mentioned secondary charges is preferably situated at a location out side the active area. The neutral bulk layer can be biased in the latter devices by the doping 1030 or by the trench structure 825.

From the FIGS. 10A to 14 one can deduce that the structures in FIGS. 1 and 5 can be produced with different techniques. For instance the layer 104 can be made by epitaxial growth and the layer 105 can be an implantation. Equally well both layers 104 and 105 can be made by implantation or by epitaxy. In the structure presented in FIG. 5 the layer 506 can also be made by epitaxy or by an implant. All the aforementioned implantations can either be blank implants or structured implants, i.e. implants performed through a patterned fotoresist. Instead of implantation diffusion could equally well be used.

There can also be one or more floating or biased guard rings of the second conductivity type between the pixels in the device of FIG. 1. In the device of FIG. 5 there can also be one or more floating or biased guard rings of the first conductivity type between the pixels. Even floating or biased MOS guard rings between the pixels can be used.

The proper biasing of the devices corresponding to FIGS. 1 and 5 is essential to the correct operation of the detector. It is required that the bulk layer 103 is fully depleted under the active area and that it is neutral at the border of the device. For example, if the voltage on the front surface of the detector is decreased even more from $V_{CS}$ in devices where the bulk layer is of the first type doping at some point the reverse biasing of the pn interface between the MIG- and bulk layers gets too low, which means that the bulk layer would not be completely depleted any more. Graphically this would be represented by a curve below curve 203 in FIG. 2, with a flat section appearing at its rightmost end. There must be also a proper amount of the guard structures otherwise the depletion region may reach the border of the device.

Signal Charge Detection

In order to make it easier to understand the principles of signal charge detection in a semiconductor detector according to an embodiment of the invention, it is advantageous to first consider certain possible ways of implementing a field effect transistor, preferably a MOSFET or JFET, or a bipolar transistor on top of a pixel doping.

Figure 15:
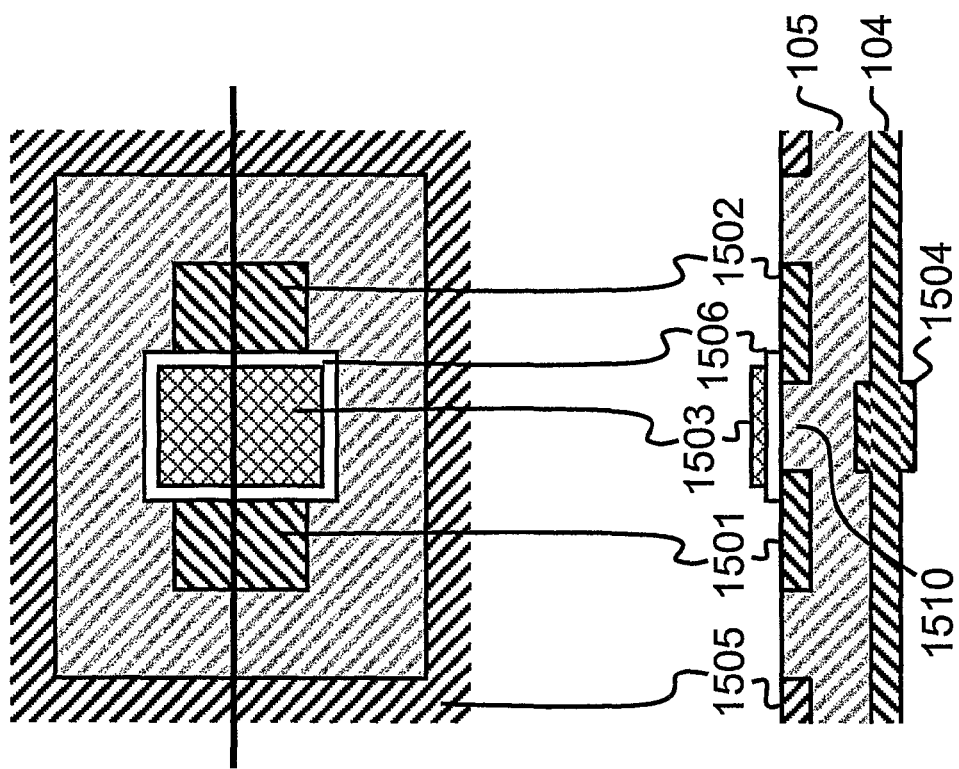
FIG. 15 illustrates a single pixel MIG device.

The upper part of FIG. 15 presents a planar view of a basic MOSFET, which in the lower part of FIG. 15 is presented as a cross section along a line marked in the upper part. The drawing illustrates a source doping 1501 and a drain doping 1502, which correspond to the second type pixel doping 111 in FIG. 1. The optional floating or biased first type channel stop doping 115 in FIG. 1 corresponds to the first type doping 1505. The MOSFET gate is 1503 is situated on top of an isolator layer 1506. Under the gate there is an optional local enhancement 1504 of the MIG layer 104 second type doping. Also shown in FIG. 15 is a buckling 1510 in the pixel doping. One can also alter the doping in the barrier layer 105 below the gate using for instance a structured implant.

Figure 16:
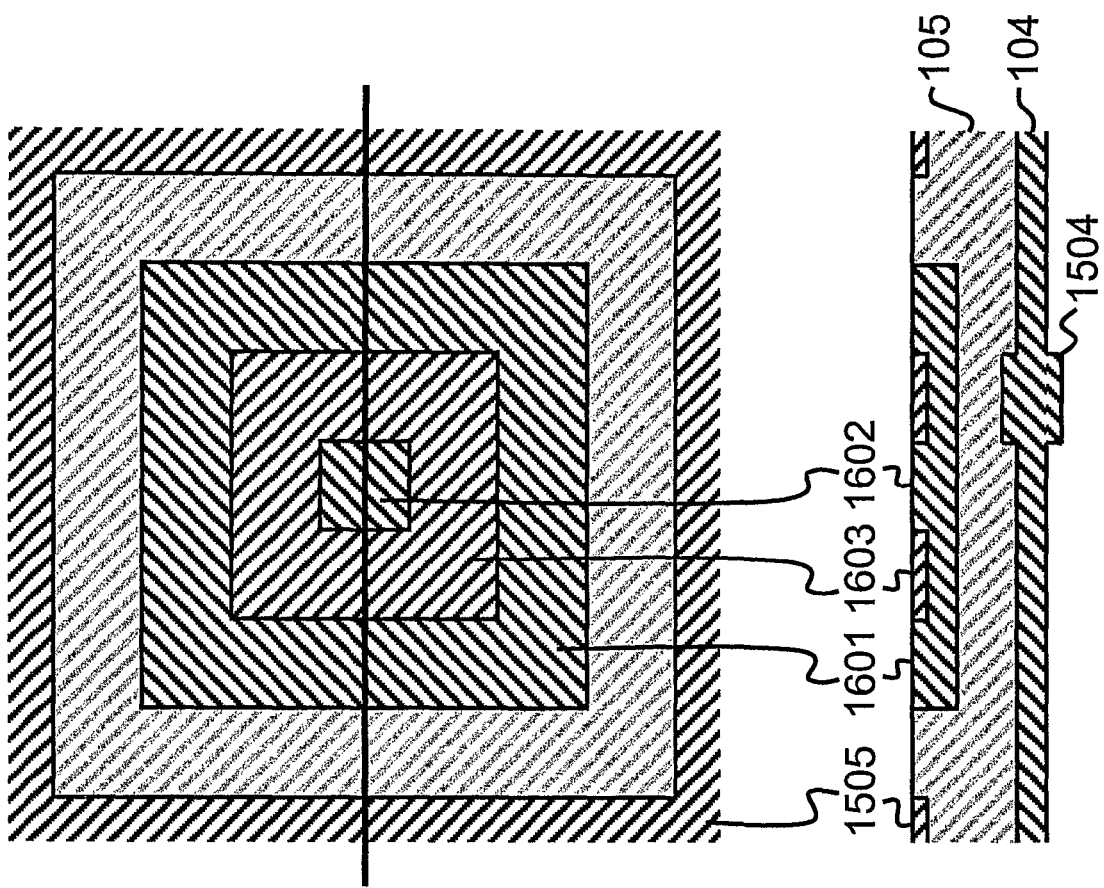
FIG. 16 illustrates a single pixel MIG device.
Figure 18:
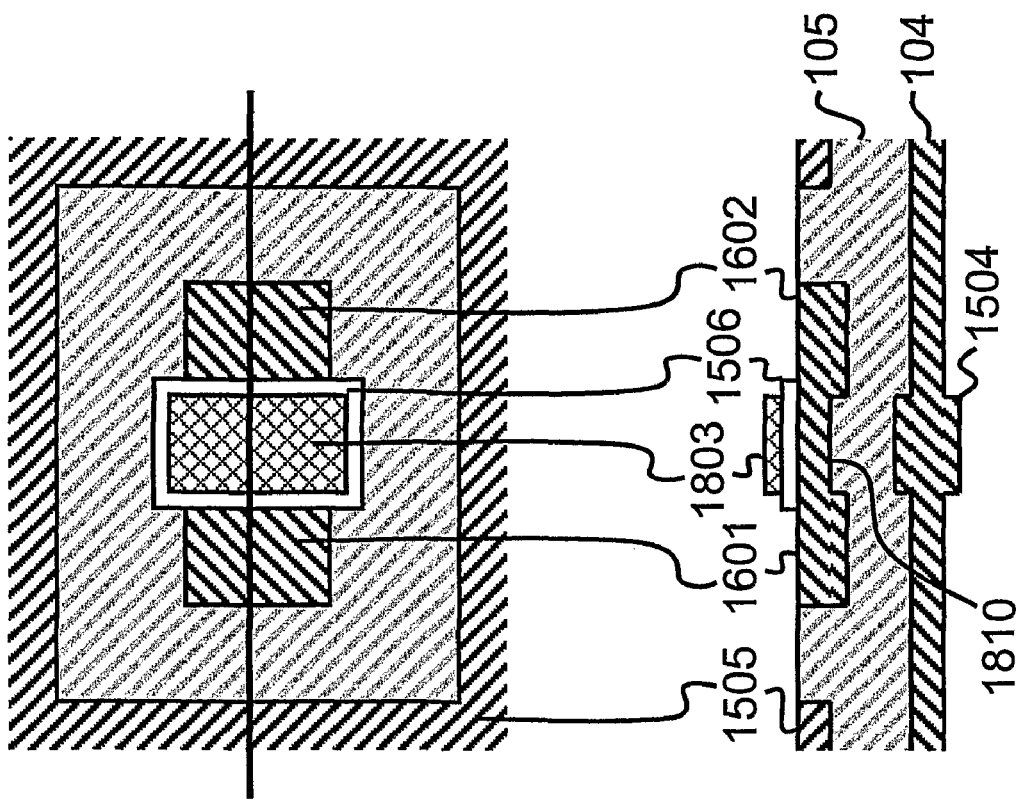
FIG. 18 illustrates a single pixel MIG device.
Figure 17:
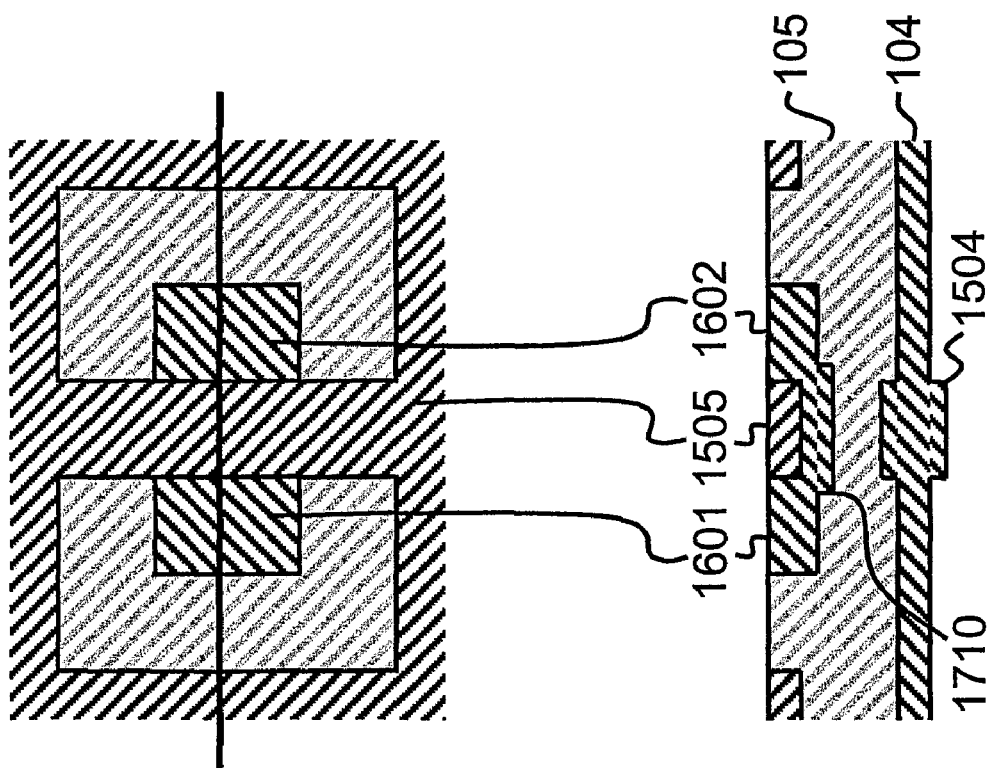
FIG. 17 illustrates a single pixel MIG device.

FIG. 16 illustrates a circular JFET where the first type gate doping 1603 is between the source 1601 and the drain 1602 which are of second type doping and correspond to the pixel doping. One should note that the places of the source and drain can be interchanged. The optional local enhancement 1504 of the MIG layer doping is preferably under only a part of the circular JFET gate. In FIG. 17 is presented a square JFET where the doping 1505 acts as the gate. Also shown in FIG. 17 is an additional buckling 1710 of the pixel doping. FIG. 18 illustrates a variation of the JFET structure where the gate doping is replaced with a MOS structure 1803, 1506. An additional buckling 1810 of the pixel doping is shown in the FIG. 18. FIG. 19 illustrates yet another possible transistor structure, namely a bipolar transistor, having a first type emitter doping 1902 and a second type base 1901 corresponding to the pixel doping.

The pixel structures presented in FIGS. 15-19 are based on the device presented in FIG. 1. The pixel structures in FIGS. 20 and 21 are given as an example of pixel structures based on the device presented in FIG. 5. The structure in FIG. 20 corresponds to the circular JFET structure in FIG. 16. The only difference is that instead of an structured pixel doping a pixel doping layer 506 is used. The first type doping 2005 acts as the channel stop. The doping 2005 can also be replaced by the first type doping 2007 which acts as a floating channel stop structure. The structure in FIG. 21 corresponds to the bipolar structure presented in FIG. 19.

Figure 24:
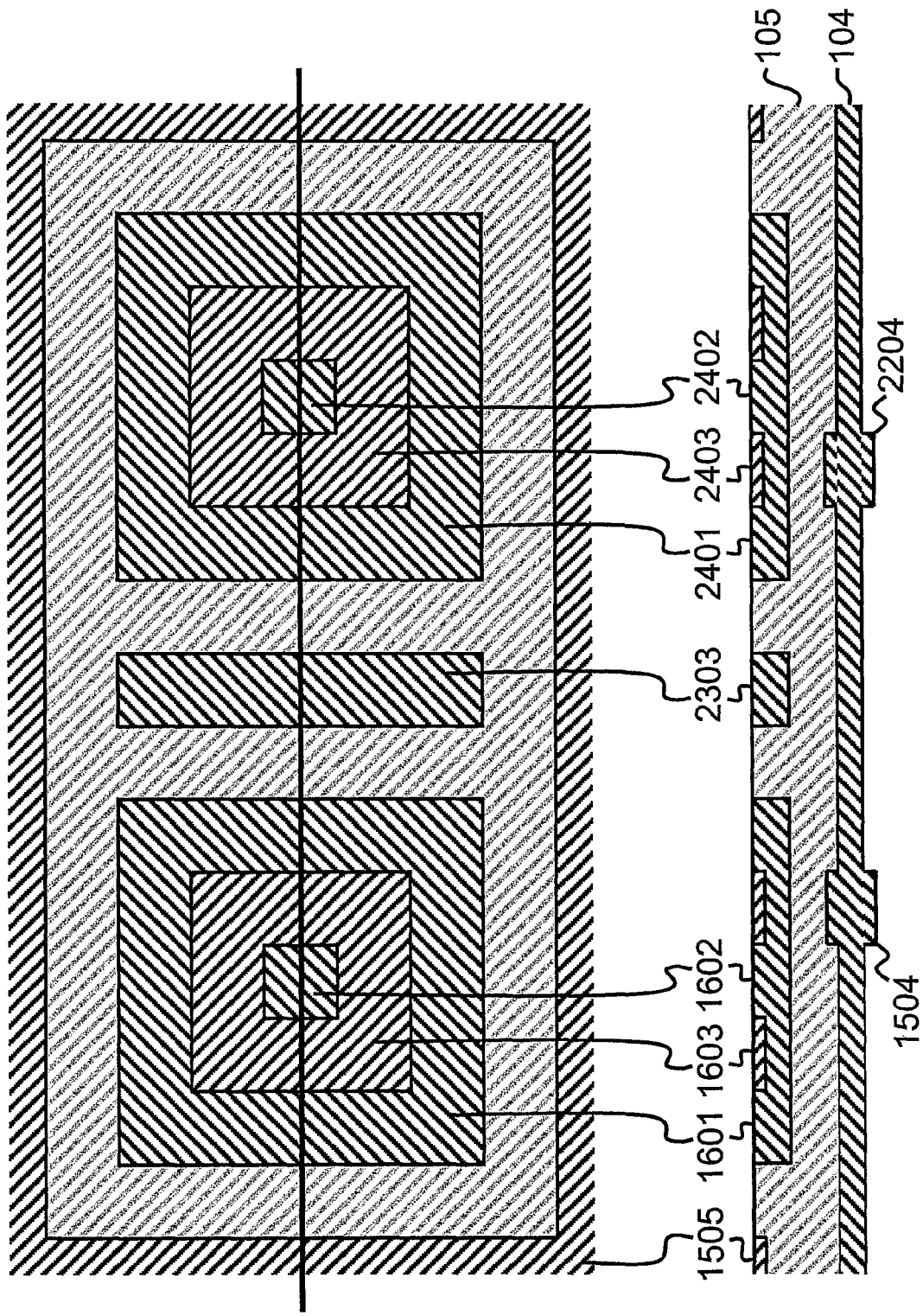
FIG. 24 illustrates a double pixel MIG device.

A pixel structure composed of two MOSFETs is presented in FIG. 22. The first type doping 2201 acting as an additional source, the additional gate 2203 and the additional optional local enhancement of the MIG layer doping 2204 are presented in FIG. 22. The source and drain locations can also be interchanged. The signal charge in the MIG layer can be transferred between the locations under the gates of the MOSFETs by applying suitable biases (or bias pulses) to the dopings 1501, 1502 and 2201 and to the gates 1503 and 2203. Such double transistor structures can be formed of all the devices presented in FIGS. 16-21. The structures in FIGS. 23 and 24 are given as an example. The double transistor structure in FIG. 23 corresponds to the bipolar structure presented in FIG. 19. The additional emitter 2302 and base 2301 are presented in the figure. Instead or in addition to the optional second type doping 2303 MOS structures could be used between the two transistors. The signal charge can be transferred between the locations under the emitters by applying suitable biases to 1901, 1902, 2301, 2302 and 2303. Instead of two separate bases 1901 and 2301 a common base could be used. In this case, however, the signal charge can be transported only by applying suitable (reverse bias) potentials to the emitters 1902 and 2302. The double transistor structure in FIG. 24 corresponds to the circular JFET structure presented in FIG. 16. The additional source 2401 drain 2402 and gate 2403 are shown in the figure. The signal charge can be transferred between the locations under the gates by applying suitable biases to 1601, 1602, 1603, 2401, 2402, 2403 and 2303. Instead of two separate sources 1601 and 2401 a common source could be used.

Figure 25:
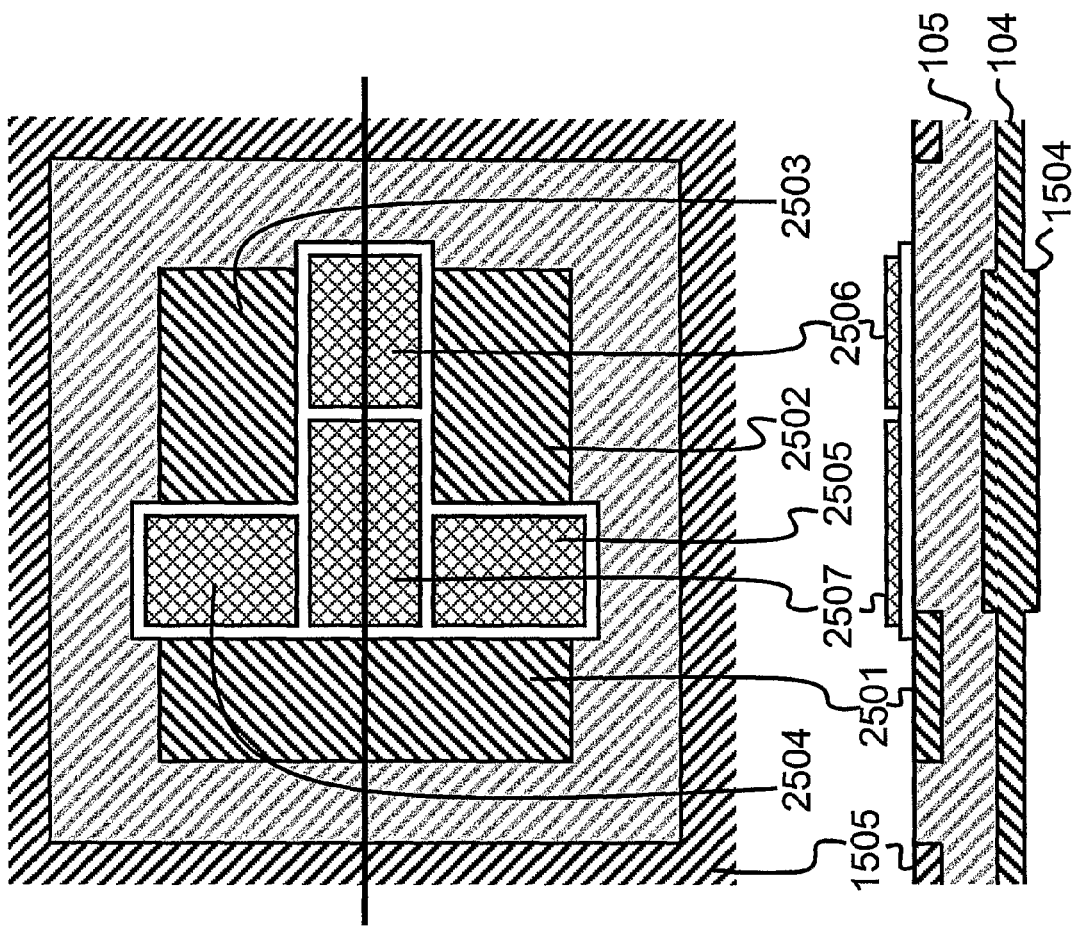
FIG. 25 illustrates a triple pixel MIG device.

A pixel structure composed of three MOSFETs is presented in FIG. 25. This structure has three dopings 2501, 2502 and 2503 functioning as sources or drains and four gates 2504, 2505, 2506 and 2507. The signal charge can be transported between the locations under the gates 2504, 2505 and 2506 by applying suitable biases to 2501, 2502, 2503, 2504, 2505, 2506 and 2507. When the signal charge is under one gate this gate is preferably the only gate which is open, i.e. the only one under which the channel is open. Different potentials are connected to the two dopings of 2501, 2502 and 2503, which are next to the afore mentioned open gate. The optional local enhancement of the MIG layer doping 1504 is situated in FIG. 25 under every gate. A structure where the optional local enhancement of the MIG layer doping 1504 is only situated under the gates 2504, 2505, 2506 and not under the gate 2507 can be used equally well. The structure in FIG. 25 is based on the MOSFET structure presented in FIG. 15 but similar structures can be formed of the structures presented in FIGS. 16-17.

Figure 26:
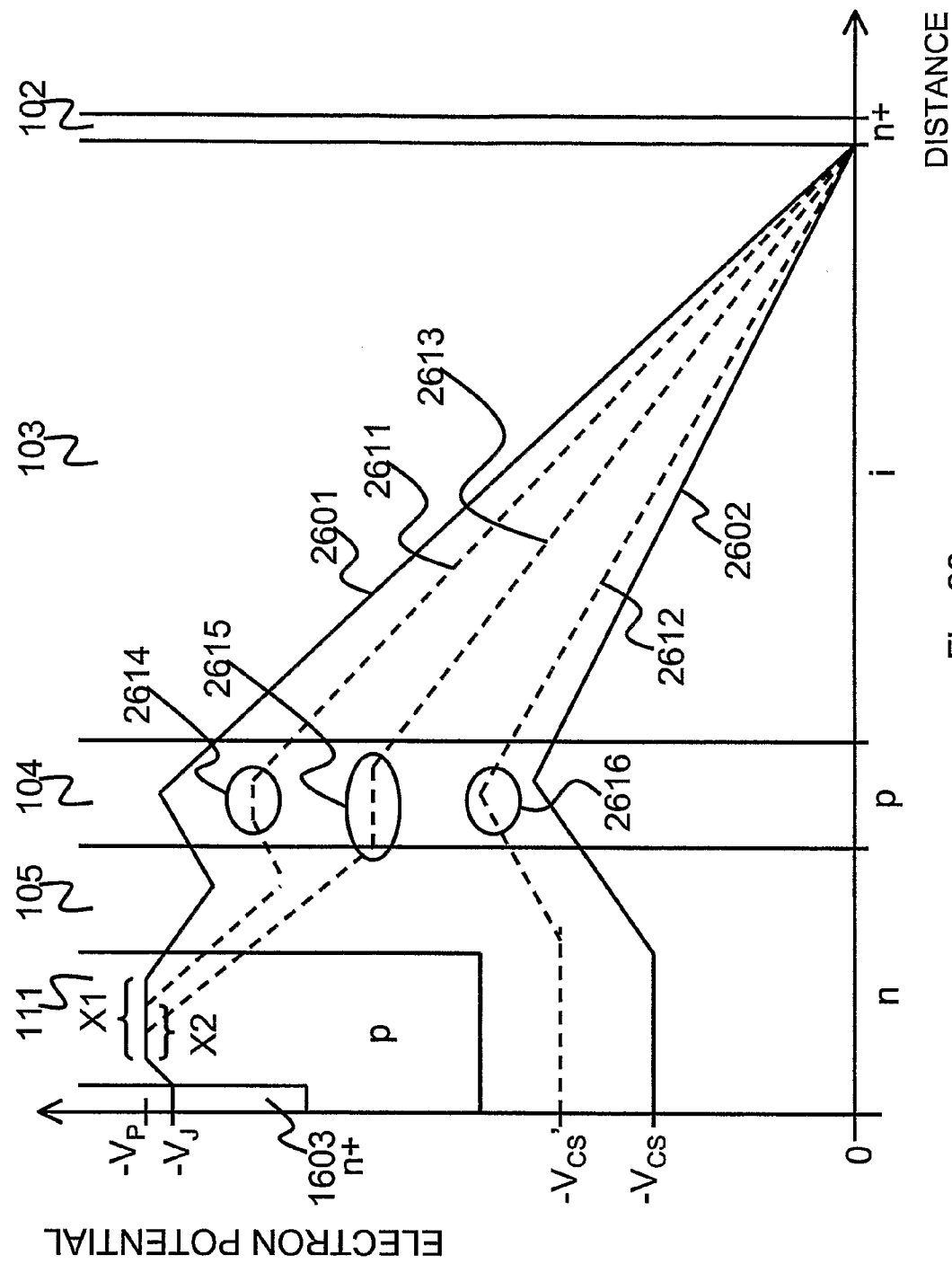
FIG. 26 illustrates the principle of signal charge detection.

Referring back to detectors having holes as signal charges, FIG. 26 illustrates how the electron potentials change as a result of signal charges being collected to pixel dopings and surface current carriers of the opposite type being collected to channel stop locations. We assume that there is a JFET associated with a pixel, with its gate connected to a voltage $V_J$, the absolute value of which is smaller than the absolute value of $V_P$. The physical implantations of the JFET and its coupling to a pixel may follow e.g. the schematic models described above with reference to FIG. 16.

In FIG. 26 curves 2601 and 2602 represent electron potentials at pixel and channel stop locations respectively before signal charge begins to accumulate in the MIG layer. Curves 2611 and 2612 illustrate how these signal potentials change after a photon has hit the detector, in case of a floating channel stop structure. If the channel stop structure is biased, 2612 would obviously be the same as 2602. The signal charge (holes) accumulating in the MIG layer 104 at pixel doping lowers the electron potential at that point, causing a neutral (i.e. flat) section 2614 to appear in the potential curve 2611. This is of importance, because simultaneously the flat section of the potential curve in the pixel doping decreases in length from X1 to X2. The length of said flat section represents the dimensions and correspondingly the current-carrying capability of the channel of the JFET. The decreasing channel dimensions can be accurately measured simply by observing changes in the current running through the JFET. In case the bipolar transistor in FIG. 19 is used instead of a JFET, one uses a specific forward bias to the emitter and measures the change in the emitter current due to the narrowing of the base. It is important to note that the noise in the base and emitter currents is coupled. The noise can be reduced considerably by monitoring base and emitter currents simultaneously which enables for instance the subtraction of the absolute value of the base current from the absolute value of the emitter current. This resultant current can be used as the signal current.

A vertical antiblooming mechanism can be explained with the help of FIG. 26. The potential function 2613 describes a situation where the MIG structure under the pixel doping is completely full of signal charges. In this case the absolute magnitude of the potential in the flat section 2615 of the MIG structure is bigger than the absolute magnitude of the local maximum in the MIG layer 2616 under the channel stop location. Thus the excess signal charge flows vertically to the pixel doping instead of blooming horizontally to the neighbouring pixels. In other words, a full pixel has still a potential barrier in the horizontal but none in the vertical direction and not vice versa. Referring to the potential diagram 2612 it is easy to understand that if the surface is especially leaky causing substantial amounts of surface current and if one wants to use long integration times, biased channel stop structures must be used. Otherwise the local maximum 2616 continues to rise and horizontal blooming will occur.

The signal charge in the MIG layer can be cleared by applying the clear potential $V_C$ between the pixel doping and the biased backside layer 102. If the backside potential is adjusted to perform the signal charge clearing, part of the charge in the floating channel stops will flow to the biased backside layer and the electron potential diagram 2612 returns back to the original position 2602. One can also clear the signal charge by applying a higher absolute potential difference between the channel stops and the pixels. Another option is to apply a higher absolute potential difference both between the pixel doping and the channel stop and between the pixel doping and the biased back side layer.

The operation principle presented in FIG. 26 allows the detection of small amounts of signal charge. It is, however, not the only possible one. If the amount of signal charge per pixel is large on average a different operation principle can be used which may be for instance the following. The pixel dopings are first connected to the clear potential $V_C$ which corresponds to signal charge clearing. Next the pixel dopings are left floating at $V_C$ which corresponds to signal charge integration phase. This means that the signal charges are collected directly by the pixel doping and not by the MIG layer. The signal charge is next measured using a FET which gate is connected to the pixel doping. Such operation principle corresponds to a floating diffusion amplifier.

In the previously introduced transistor structures corresponding to FIGS. 15-19 the pixel doping has a different depth in the structures of FIGS. 15, 17, 18 and 19 under the MOSFET and the JFET channel and under the emitter of the bipolar transistor. With the help of the bucklings 1510, 1710 and 1810 one can confine the signal charge under the MOSFET and JFET channel and the emitter improving the sensitivity of the devices. Another way to confine the signal charge is achieved by altering locally the MIG layer 104 doping using for instance an optional local enhancement 1504 of the MIG layer doping. Yet another way to confine the signal charge is to alter locally the doping of the barrier layer 105. Without these measures the signal charge would fill first the location under the drain of the MOSFET and JFET pixels, where the signal charge has only a minor effect on the channel width. In the bipolar pixel the signal charge would spread under the whole base doping, having a lesser effect on the base width.

There are two different types of buckling of the pixel doping. In the pixel structures of FIGS. 17 and 19 the pixel doping is deeper under the desired areas and in 15 and 18 it is shallower. Which one of these cases should be chosen depends on the doping levels and thicknesses of the layers in the layered structure and on the biasing of the structure. The deeper buckles, however, give rise to a smaller parasitic to total capacitance ratio of the MIG structure. The emitter push effect can be utilized to achieve self-alignment of the deeper buckles 1710 under the bipolar emitter and JFET gate implants in FIGS. 17 and 19. The gate shielding in MOS structures can be used to create a self-alignement of the deeper buckles 1510 and 1810 in FIGS. 15 and 18. One should note that the effects of the buckles can be enhanced or removed by the two other aforementioned methods.

The optional local enhancement 1504 of the MIG layer 104 second type doping can be made for instance by a structured deep implant. If the first type barrier layer 105 is manufactured by epitaxial growth the optional local enhancement 1504 of the MIG layer doping can also be done using a structured implant before growing the epilayer. One can increase the second type doping at the location of the local enhancement 1504 of the MIG layer doping using a second type structured implant. One can also reduce the second type doping out side the location of the local enhancement 1504 of the MIG layer doping using a first type structured implant. For example in FIG. 15 the optional local enhancement 1504 of the MIG layer doping is situated directly under the gate of the MOSFET. It can, however, be shifted a little bit towards the source.

Instead of the local enhancement 1504 of the MIG layer doping one can alter the doping of the barrier layer 105 locally. Such a local alteration of the barrier layer doping 105 can be done for instance by decreasing the doping of the barrier layer using a second type implant at the location of 1504. The local alteration of the barrier layer 105 doping can also be made by increasing the doping of the barrier layer using a first type implant out side the location of 1504. In this case gate shielding of the MOS structure can be used for self alignement purposes. The threshold adjustment implant can also be used to alter the barrier layer doping.

It is important to note that any combination of the three afore mentioned methods can be used. The most promising of the three methods is, perhaps, the enhancement of the MIG layer doping 1504.

A part of the excess signal charge arising from a full MIG structure will add to the measured drain current in the MOSFET and JFET structures corresponding to FIGS. 15-18, if the antiblooming mechanism is functional. This is, however, only a problem in case there is a very bright spot in the image. If the source current is measured this phenomenon should not be a problem.

Figure 27A:
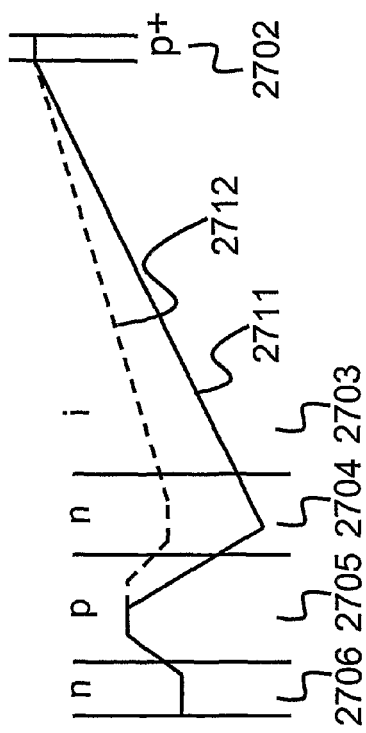
FIG. 27A illustrates the operation principle of an JFET IG structure.
Figure 27B:
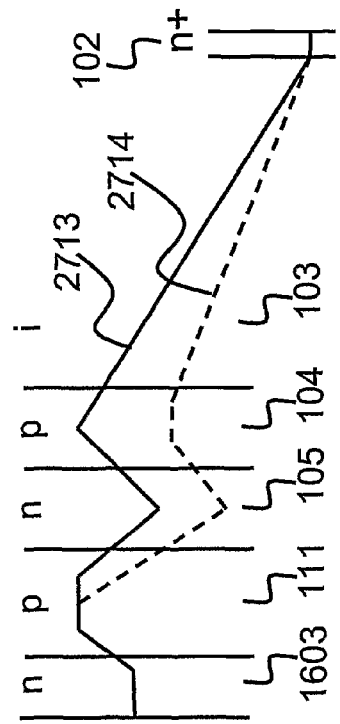
FIG. 27B illustrates the operation principle of the JFET MIG structure.
Figure 27C:
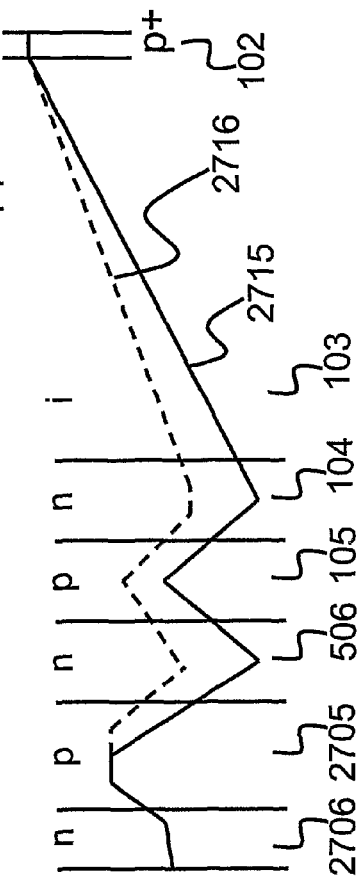
FIG. 27C illustrates the operation principle of another JFET MIG structure.

The operation principle of the MIG structure can be further analyzed with the help of the electron potential diagrams in FIGS. 27A, 27B and 27C. All the flat sections of the diagrams refer to neutral areas and the sloping areas to depleted areas. In FIG. 27A is presented the traditional internal gate (IG) structure of a JFET, where the IG is formed in the layer 2704. The layer 2706 is the JFET gate implant, the layer 2705 is the JFET channel, 2703 is the substrate and 2702 is the biased backside layer. The electron potential function 2711 represents the situation, when no charge is in the IG structure and 2712 when charge is present in the IG. The charge in the IG structure widens the JFET channel, i.e. the flat part of the potential function in the layer 2705. According to FIG. 17A it is evident, that the IG structure does not allow bipolar operation, since the emitter current from the area 2706 would flow to the IG in 2704.

The MIG structure according to the JFET in FIG. 16 is presented in FIG. 27B. The electron potential function 2713 presents the case when no charge is in the MIG layer 104, and the function 2714 the case when charge is in the MIG layer. This charge narrows the JFET channel in the layer 111. The MIG structure in FIG. 27B clearly allows bipolar operation since the emitter current will not flow to the MIG structure. In FIG. 27C is presented a different MIG structure having a similar operation principle than the IG structure. When charge is added to the MIG layer 104 it changes the electron potential function from 2715 to 2716, i.e. the charge in the MIG layer widens the JFET channel in the layer 2705. The bipolar operation is, however, possible.

As a summary of the differences in FIGS. 27A, 27B and 27C, one can state, that in the IG structure of FIG. 27A there is one pn junction and no completely depleted layers between the signal charge and the FET channel. In this configuration the electron potential function is a monotonous function between the signal charge minimum in the internal gate structure and the FET channel. In the MIG structure of FIG. 27B there are two pn junctions and one completely depleted layer between the signal charge and the FET channel or bipolar transistor base. This configuration enables the formation of one saddle point for both the secondary and the signal charges in between the signal charge minimum in the MIG structure and the FET channel or the bipolar base. One should note that if the MIG structure is not well designed or if the manufacturing process is not optimal a small neutral area may be formed at the location of the saddle point. Such a neutral area ads noise to the measurement and should thus be strictly avoided. The neutral area will, however, not change the operation principle of the device. The structure in FIG. 27C contains two oppositely doped layers 506, 105 more than the IG structure in FIG. 27A.

In the structure of FIG. 27C there are three pn junctions and two depleted layers between signal charge and the FET channel or bipolar transistor base. This configuration enables the formation of two saddle points for both secondary and signal charges in between the signal charge minimum in the MIG structure and the FET channel or the bipolar base. If two additional oppositely doped layers are added to the structure in FIG. 27B, one could form three saddle points for both secondary and signal charges between the signal charge minimum in the MIG structure and the FET channel or the bipolar base. The signal charge in the MIG structure of this device would narrow the FET channel or the bipolar base like is the case in FIG. 27B. Such a structure would not add any functionality to the device in FIG. 27B at the cost of a more complex structure and a higher parasitic capacitance to total capacitance ratio. One could of course add even more layers and junctions in between, but like already stated there appears to be no benefit in doing so.

Figure 28A:
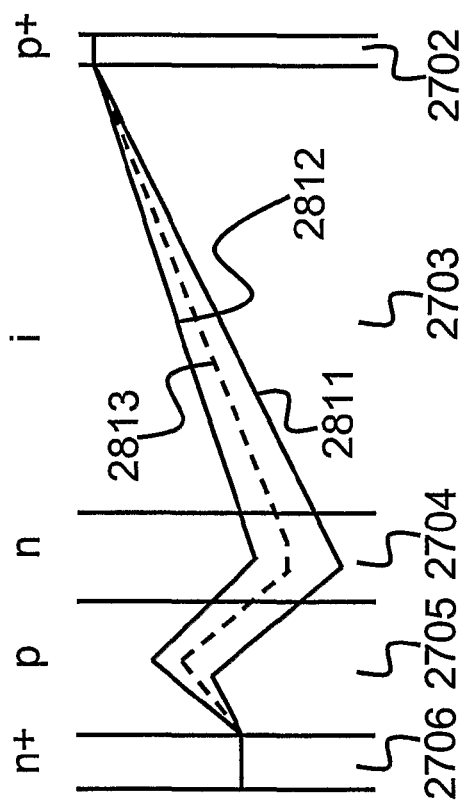
FIG. 28A illustrates further the operation principle of a JFET IG structure.
Figure 28B:
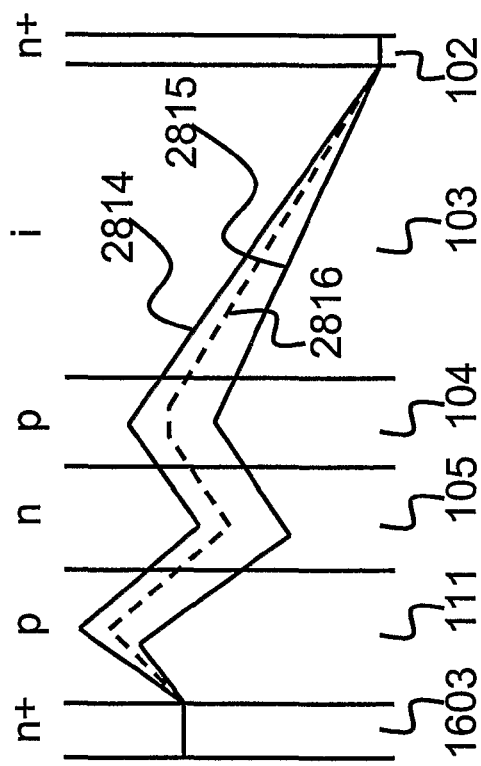
FIG. 28B illustrates further the operation principle of a JFET MIG structure.

The differences in the operation of the devices shown in FIGS. 27A and 27B are further analyzed in FIGS. 28A and 28B where it is assumed that the IG and MIG dopings have fluctuations and that the channels of the JFETs are closed. The potential functions 2811 and 2812 present the case when no signal charge is in the IG structure. The potential function 2811 is situated in a location having the highest amount of the IG dopant atoms. The potential function 2812 on the other hand is situated in a location having the lowest amount of the IG dopant atoms. The signal charge electrons start to accumulate first the potential functions 2811 minimum in the IG layer 2704. This is shown by the potential function 2813 which corresponds to the location of the potential function 2811. The flat neutral section of the potential function 2813 in the IG layer 2704 is resulted due to the occupation of signal charge electrons. At this stage the neutral area has not yet reached the potential functions 2812 minimum in the IG layer 2704.

One can see that the potential function 2812 has the highest local maximum in the JFET channel layer 2705 of all the potential functions 2811, 2812 and 2813. If the channel of the JFET is carefully opened current starts to run first at the location of the potential function 2812, i.e. at the location having the minimum amount of IG layer dopant atoms. At this location, however, the signal charges have no effect on the current running through the JFET. Thus the JFET channel has to be opened further so that current is running also at locations where the IG layer is occupied by signal charges. The potential function 2811 has the lowest local maximum of all the potential functions 2811, 2812 and 2813. Thus the channel has to be most widely open if only very few signal charges are to be detected. In other words, the smaller the signal charge the higher the current running through the JFET channel. It is evident that small amounts of signal charge cause small variations in a large current making the detection of small amounts of signal charge very challenging. This is the reason why the IG doping has to be extraordinary homogeneous. The afore mentioned problem applies also to the device presented in FIG. 27C.

The potential functions 2814 and 2815 present the case when no signal charge holes are in the MIG structure. The potential function 2814 is situated in a location having the highest amount of MIG dopant atoms and the potential function 2815 is situated in a location having the lowest amount of MIG dopant atoms. The potential function 2814 has the highest local maximas both in the MIG layer 104 and in the JFET channel 111. The signal charge holes start to first accumulate the potential functions 2814 local maximum in the MIG layer and as a result the local maximum in the JFET channel lowers. This is shown by the potential function 2816. If the JFET channel is opened carefully a small current starts to run at the location where the signal charges are located. Small amounts of signal charge located in the MIG structure are thus able to cause big variations in a small current. The afore mentioned fact facilitates considerably the detection of small amounts of signal charge.

Figure 29A:
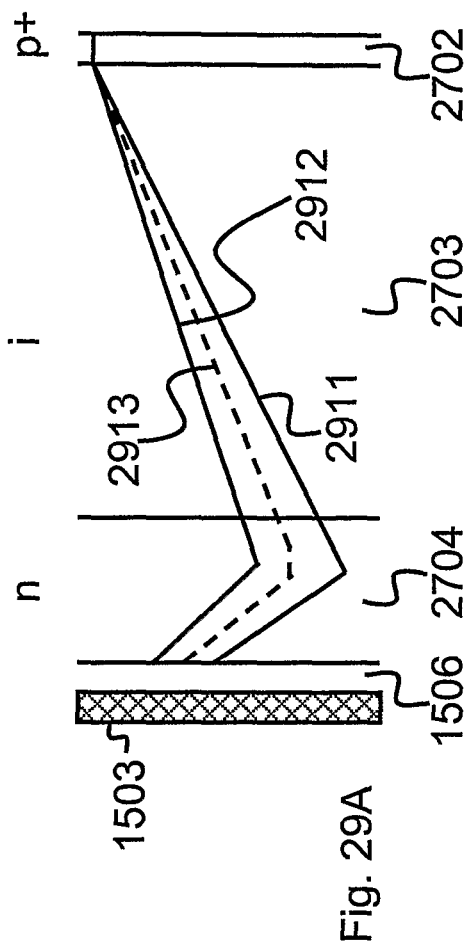
FIG. 29A illustrates the operation principle of an MOSFET IG structure.
Figure 29B:
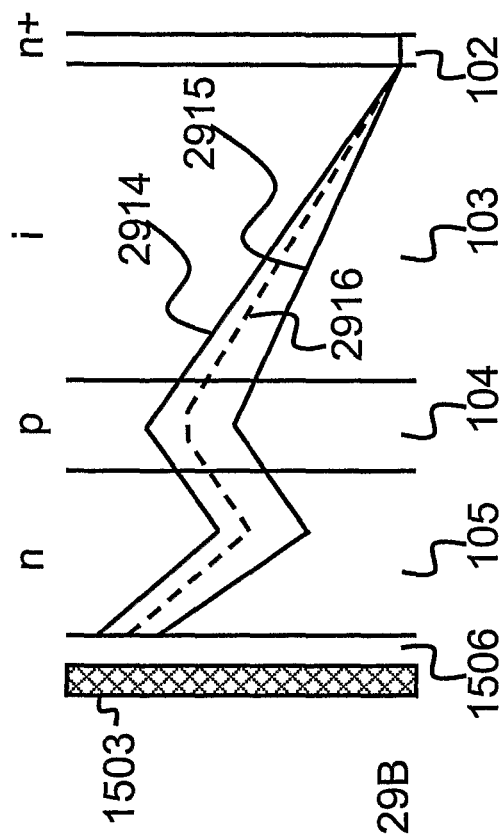
FIG. 29B illustrates the operation principle of the MOSFET MIG structure.
Figure 31:
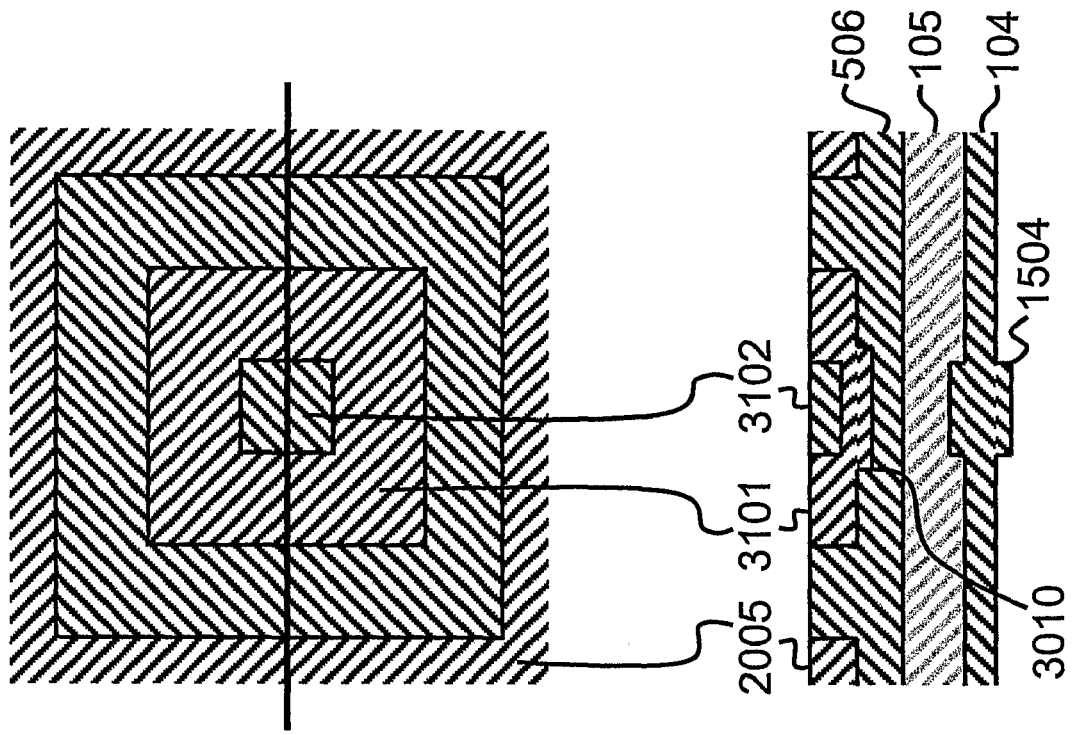
FIG. 31 illustrates a single pixel MIG device.
Figure 30:
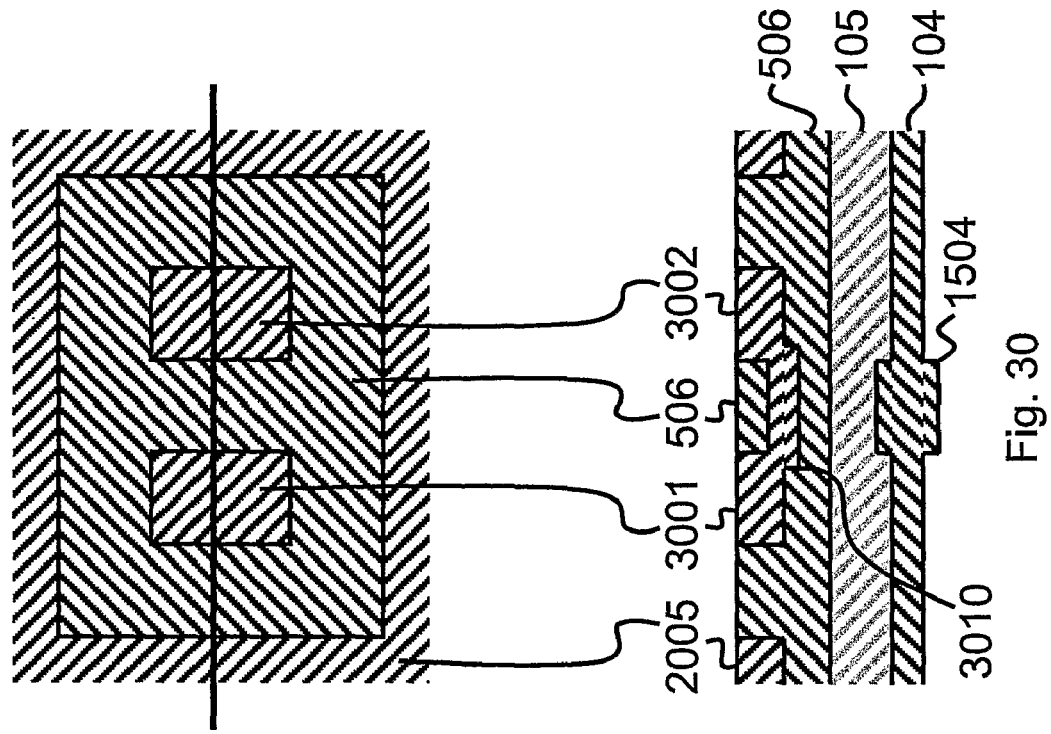
FIG. 30 illustrates a single pixel MIG device.

The FIGS. 29A and 29B correspond to MOSFETs having an IG and a MIG structure. It is assumed that the IG and MIG dopings have fluctuations and that the channels of the MOSFETs are closed. The potential functions 2911 and 2914 are situated in locations having the highest amount of the IG layer 2704 or MIG layer 104 dopant atoms and the potential functions 2912 and 2915 are situated in locations having the smallest amount of IG or MIG dopant atoms. The potential functions 2913 and 2916 correspond to potential functions 2911 and 2914 having signal charges in the IG or in the MIG structure. The situation in FIGS. 29A and 29B resembles the situation in FIGS. 28A and 28B. The change in current due to certain amount of signal charge is similar in the devices but a considerably higher current is running through the MOSFET utilizing the IG structure than through the MOSFET utilizing the MIG structure.

Referring to FIGS. 28B and 29B it is obvious that the signal charges can be confined below only a part of the FET gate using for instance the optional local enhancement 1504 of the MIG layer doping (FIGS. 16, 20 and 24. Note that the doping profile of 1504 can also be graded). Such an arrangement lowers the capacitance of the MIG structure improving the detection of very small amounts of signal charge. This is, however, not possible in IG structures where the IG doping must be very homogeneous under the FET gate. Due to this fact problems are resulted at the gate edges in square MOSFETs. The gate edges refer here to areas not next to source or drain dopings. If the IG doping reaches further than the gate edges a signal charge potential energy minimum is created in the IG layer next to the gate edge location where the signal charge is not affecting the current running through the channel of the MOSFET. If the gate reaches further than the IG doping a lot of current is running through the MOSFET channel at the edges of the gate. Thus it is evident that misalignment must be avoided otherwise both of the afore mentioned problems may exist at the same time. In square MOSFETs the edge locations require also careful planning to prevent the surface leakage current from flowing to the IG. In the square JFETs of U.S. Pat. No. 5,786,609 the JFET gate and the IG structure are connected at the JFET gate edges meaning that surface generated charges will mix with the signal charge.

The afore mentioned gate edge problems do naturally not exist in the circular FETs. The gate area and thus the IG structure area in circular FETS is, however, rather large which increases the capacitance of the IG structure. The large size of the IG structure area is also prone to IG doping fluctuations. A disadvantage of both the square and circular IG MOSFET is also the fact that the channel must be kept open at all times otherwise charges generated at the depleted interface between the semiconductor and the gate isolator will mix with the signal charge. This makes naturally the signal charge transport between different IG structures in double transistors more difficult. A benefit of the MIG structure compared to the IG structure is also that no reset contact is needed.

Figure 33:
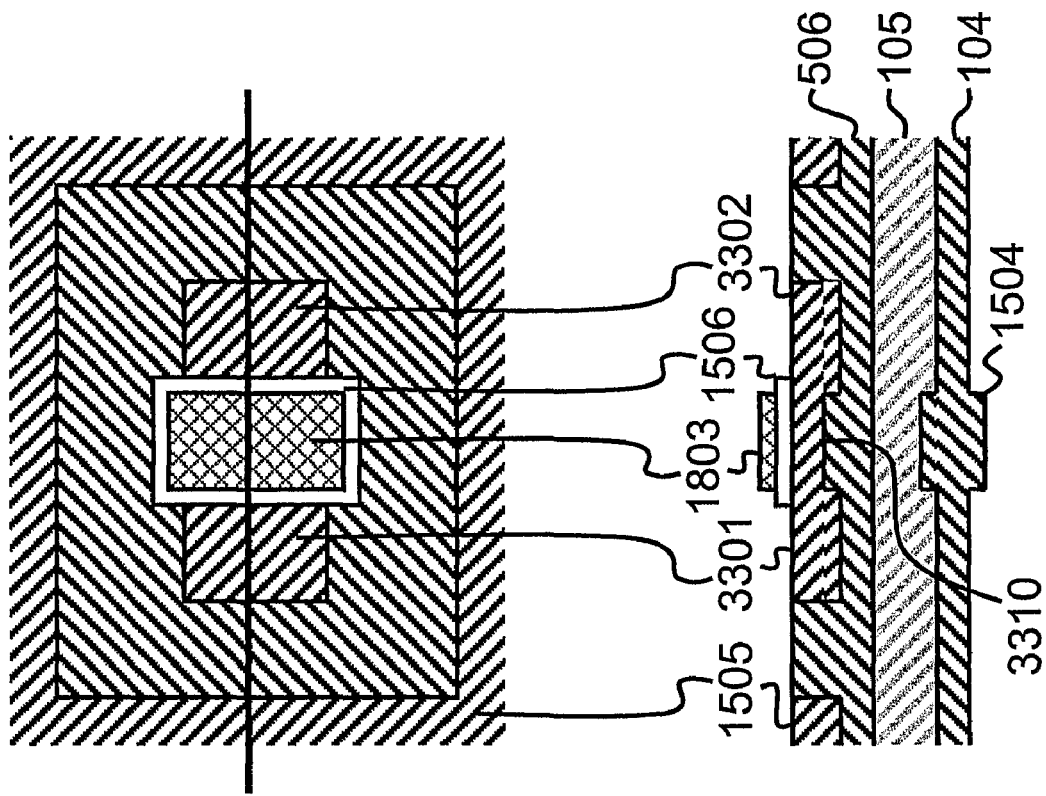
FIG. 33 illustrates a single pixel MIG device.
Figure 32:
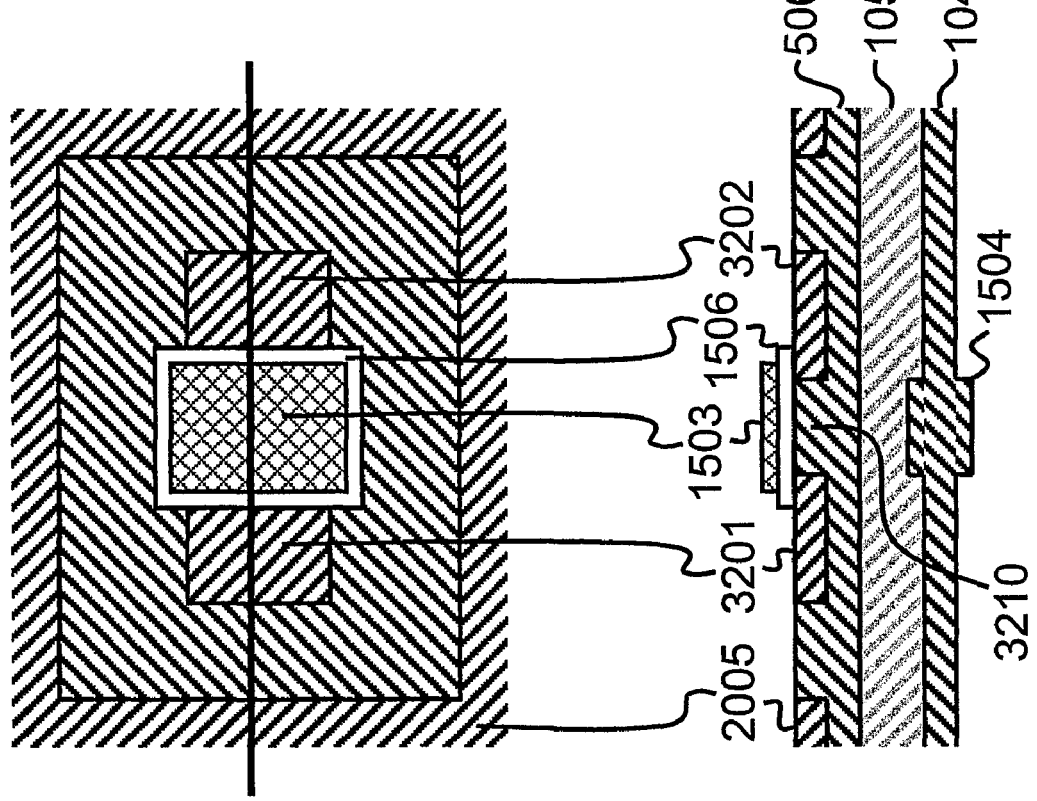
FIG. 32 illustrates a single pixel MIG device.

Some examples of devices based on the MIG structure presented in FIG. 27C are presented in FIGS. 30, 31, 32 and 33. The device in FIG. 30 contains a square JFET having a source 3001 and a drain 3002. One can see that a doping inside the pixel layer 506 can also have buckling 3010. The device in FIG. 31 contains a bipolar transistor having a base 3101 and an emitter 3102. A device containing a MOSFET is presented in FIG. 32 having a source 3201 and a drain 3202. A buckling 3210 associated with the MOS structure is drawn in the figure. The device in FIG. 33 is a modified JFET where a MOS structure is acting as the JFET gate. A buckling 3310 associated to the doping forming the source 3301 and the drain 3302 of the JFET is shown in the figure.

The signal charge in the MIG layer can be read for instance by a technique, where the drains (or sources) of the amplifiers are connected in columns and the gates are connected in rows. A desired pixel can be selected by opening up the JFET or MOSFET channels in one row with a suitable gate voltage and by connecting a voltage difference of correct polarity between the drain and source in one column of drains (or sources). The gates in all other rows remain closed and the voltages in all other columns of drains (or sources) are same as the source (or drain) voltage. The signal charge in the MIG layer can then be determined from the drain (or source) current or from a corresponding voltage output. This measurement can also be compared to the measurement of an empty MIG structure. In case of the double transistors presented in FIGS. 22-24 (and the triple transistor in FIG. 25) the signal charge can be exchanged many times between the MIG structures of the different transistors and a comparison between the measurements of the empty and occupied MIG structure can be done many times.

The readout of the structure presented in FIG. 17 differs from the other FETs since the gate voltage of individual pixels can not be altered. One can for instance connect the drains in columns and sources in rows. The sources and drains are normally kept at same potential. The reading is done by connecting for instance a suitable voltage to one column of drains and by measuring the currents running through the rows of sources.

The bipolar transistors can be read by a similar fashion than the FETs, i.e. by lowering the reverse biasing of the emitter junction in one row of emitters and in one column of bases, so that only in the selected pixel the emitter junction is turned on. The signal charge is then measured from the emitter current or from a corresponding voltage output. Like already mentioned before one can also measure the base current in order to reduce the noise. Instead of the afore mentioned read operations, one could also add selection transistors into each pixel, but they consume space and make the structure more complicated. Yet another way to read the signal charge is to bond the detector chips by a flip chip technique to a read chip.

In a particle, X-ray and gamma ray detectors it is some times necessary to find out the exact time, location and energy amongst several simultaneous events. This can, however, not be achieved using a floating source FET comprising the MIG structure. This is due to the fact that an increase in the amount of signal charge in the MIG structure closes the channel of the FET even more. In a floating source FET having an IG the situation is the opposite: the increase in the signal charge opens the channel of the FET even more allowing an instant source current pulse to be formed. One can, however, use a floating emitter bipolar transistor comprising the MIG structure instead of the floating source FET. This arrangement requires that the base below the emitter is depleted. The depleted base forms a barrier to the floating emitter. An increase of the signal charge will lower this barrier allowing an instant emitter current pulse to be formed.

A floating emitter bipolar transistor comprising a MIG structure is presented in FIG. 34. The optional second type dopings 3401 and 3402 can be used for signal charge clearing. The floating emitters can be refilled by reducing the reverse biasing between the base and the channel stops for a short while. Another option is to connect the floating emitter to the drain of a FET. During the emitter filling the gate of the FET is opened for a short while. Otherwise the drain is left floating.

One should note that the emitter 1902 size can be larger than the local enhancement of the MIG doping 1504.

The floating emitter can be covered by an isolator layer on top of which can be a conductor layer 3403. The conductor layer can be connected to a read out chip. One can also connect the floating emitter to a conductor plate which is isolated from the surroundings by an isolator material. This floating conductor plate can be covered by another conductor plate which is connected for instance to a read out chip. The latter conductor plate can also be divided to three different sectors which are isolated from each others. These sectors can be further connected to other sectors of different pixels forming a line. In this manner every amplifier is connected to three different lines being electrically isolated from each other and proceeding into three different directions. The events can then be traced by observing the signals arriving from three multitudes of lines extending into three different directions.

A floating source FET comprising the MIG structure can be made for instance by covering the source by an isolator layer. The isolator layer is next covered by a conductor layer forming a capacitor plate. The capacitor plate may or may not be connected to the FET gate. The drains of the FETs are for instance connected to columns and the capacitor plates are connected to rows. The capacitor plates can also be connected to a read out chip. The floating source FETs comprising the MIG structure can be square or circular MOSFETs or JFETs. The floating source FETs comprising the IG structure can only be circular JFETs. The floating source FET comprising the MIG structure has one benefit compared to the standard FET comprising the MIG structure. The benefit is that the start and the end times of the signal charge integration period can be exactly the same for all of the pixels. This can be achieved for instance in the following manner.

The signal charge is cleared from the MIG layer by the application of the clear potential $V_C$ to the drain of the FET. Next the drain of the FET is connected to pixel potential $V_P$ which starts the signal charge, integration period. It is important that the channel of the FET is closed at the beginning of the integration period. The signal charge accumulation in the MIG layer closes the channel of the FET even more. The integration period is stopped by applying a suitable potential pulse to all drains of the FETs simultaneously. This potential pulse fills the floating sources of the FETs to a level corresponding to the amount of signal charge in the MIG structure at the exact moment of the pulse. The signal charge will be read by applying a suitable potential to one line of drains and by integrating the current pulses in the capacitor plate line. The smaller is this charge the bigger was the signal charge in the MIG structure in the end of the integration period. After all the drains are connected to the afore mentioned suitable potential the drains are connected to the potential $V_C$.

One should note that the floating source may also be connected to a floating drain of an additional FET. The integration period can then be started and stopped by opening the gate of the additional FET. It should be noted that all the previously introduced capacitors may be of any shape. Multilayered stack capacitors could for instance be used.

In order to reduce the ratio of the parasitic and total capacitances, the layers on top of the bulk layer should be made as thin as possible, i.e. as thin as the process tolerances allow. The electric field values inside the device must, however, be below the avalanche breakdown value. If the multiplication of the signal charge is not desired the electric field values must be below the avalanche generation limit.

It should be noted that the invention does not necessarily require a transistor to be implemented at each pixel. It is completely possible to only bring an electrical contact to each pixel and to operate the detector in CTD mode, in which alternately coupling the pixels to certain charge transfer voltages will cause the signal charge to migrate towards the end of each pixel row or column, where a specific readout pixel is used to synchronously detect the transferred charge of each pixel in the row in turn. However, in CTD mode the detector is much more prone to the adverse effects of smearing than in APS mode, in which each individual pixel can be read separately. An additional advantage of utilising the invention in APS mode is the possibility of concentrating rapid consecutive read operations to only some arbitrarily selected part of the active area, where an interesting phenomenon has been noted to appear, possibly combined with only "updating" overall read operations at some regular, longer intervals.

Pixel and Other Pattern Structures

Figure 35C:
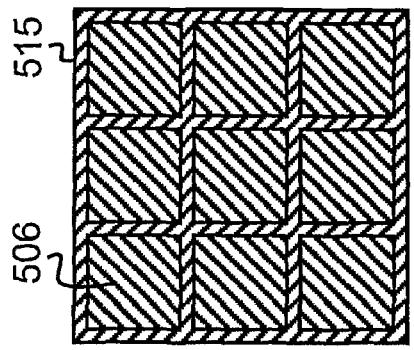
FIG. 35C illustrates another APS device with channel stop implants.
Figure 35B:
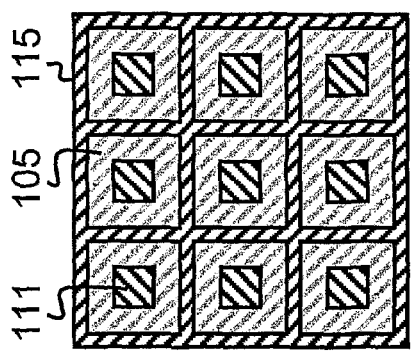
FIG. 35B illustrates an APS device with channel stop implants.
Figure 35E:
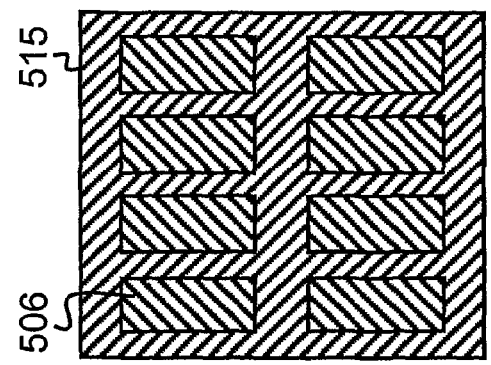
FIG. 35E illustrates another CTD.
Figure 35A:
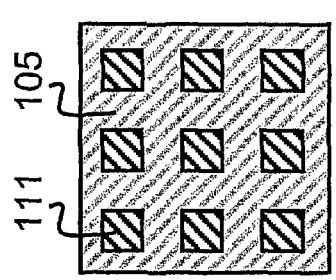
FIG. 35A illustrates a simple APS detector.
Figure 35D:
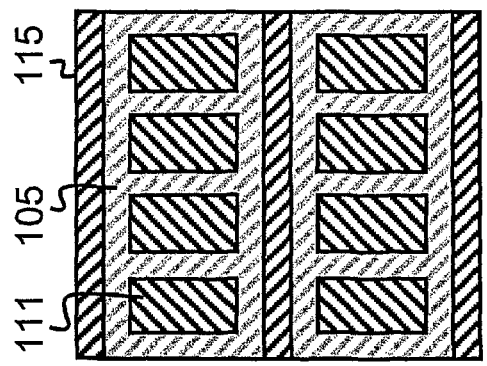
FIG. 35D illustrates a CTD.

In FIGS. 35A and 35B are presented different pixel detector structures corresponding to the structure in FIG. 1. FIG. 35A presents a very simple floating channel stop detector structure. In the detector structure of FIG. 35B a floating or biased channel stop doping 115 is added to the structure in FIG. 35A. The structure in FIG. 35C corresponds to the device of FIG. 5. The channel stop dopings in FIG. 35B can be discontinuous like is the case in the detector for structure of FIG. 35D which can be used as a CTD. The signal charge in the MIG layer can be transported using for instance a three phase technique applied to the potentials of the different pixel dopings. One can also use MOS structures between the pixel dopings in the same manner than is done in FIG. 22 to facilitate the signal charge transport. The structure in FIG. 35E is based on the structure of FIG. 35C and it can also be used as a CTD. Like already mentioned before floating or biased guard structures, can be added between the pixel doping and the channel stop locations in FIGS. 35A, 35B, 35C, 35D and 35E. Such guard structures can be doped areas and/or MOS structures. Using such guard structures one can create a drift detector based on the MIG structure. The bucklings, the enhancement of the MIG layer doping and the alteration of the barrier layer can be used to guide the drifting signal charge. The biasing of pixel dopings and optional MOS structures between the pixel dopings can be altered in order to create local potential minima in the MIG layer and in order to remove these local potential minima in the same fashion than is done in a controlled drit detector (CDD). The number of the pixels and the shape of the pixels is not limited. One can also use elongated pixels to create a strip detector. The active area constituting of pixels, like shown in FIGS. 35A, 35B, 35C, 35D and 35E can be surrounded by floating or biased guard structures of first or second type of conductivity and these areas may contain read and selection electronics.

It is important to note that in many semiconductor materials Schottky and ohmic contacts are preferred instead of dopings. One could for instance replace the pixel doping 111, the channel stop dopings 115 and 515, the back layer 102 and for example the source, drain, gate and emitter contacts by suitable metals. High dose contact implants may, on the other hand, be necessary with contacts made for instance to the dopings 111, 506, 115 and 515. One can also attach the front side of the device to a support substrate and thin the backside of the device in order for the device to reach a desired thickness. The bulk layer of a thin device may be more heavily doped than the bulk layer of a thick device. The biasing of the bulk layer can also be done using a contact made to the edge of the substrate.

Practical Applications

A semiconductor radiation detector according to an embodiment can most advantageously be used for detecting UV radiation, visible light, near or far infrared radiation and/or soft X-rays. The area of application can be extended remarkably towards energetic X-rays having quantum energy of over 10 keV by covering the back surface of the detector with a scintillator material. In such a case the detector would not detect the incident X-rays as such but the scintillation quanta that arise when the X-rays hit the scintillator material.

The decreased levels of leakage current that can be achieved through the invention allow the detector to be made of other semiconductor materials than silicon, which other materials may have been previously considered to involve prohibitively high levels of leakage current. Such other semiconductor for materials include (but are not limited to) germanium, gallium arsenide and cadmium telluride.

A device that includes a detector according to an embodiment of the invention may also include other semiconductor chips, some of which may have bonded connections to the pixels of the detector. This enables building very compact structures that include detection, amplification, reading and in some cases even storage in a very small space, like an MCM (multi-chip module).

The non-destructive way of reading the amount of accumulated signal charge by observing the way in which it affects the electrical behaviour of a field-effect transistor allows reading the same charge many times before it is cleared. In other words, the accumulation of charge at different pixels can be monitored essentially continuously.

The invention claimed is:

1. A semiconductor radiation detector device, comprising:
   a conductive backside layer (102) and
   a bulk layer (103) of a semiconductor material,
   characterised in that it comprises, on a surface of the bulk layer (103) opposite to the conductive backside layer (102), in the following order:
   a modified internal gate layer (104) of semiconductor of second conductivity type,
   a barrier layer (105) of semiconductor of first conductivity type and
   pixel dopings (111, 112, 506, 511, 512) of semiconductor of the second conductivity type, adapted to be coupled to at least one pixel voltage in order to create pixels corresponding to pixel dopings, said pixel voltage being defined as a potential difference to a potential of the conductive backside layer (102).

2. A semiconductor radiation detector device according to claim 1, wherein said modified internal gate layer (104) and said barrier layer (105) are continuous throughout an active area comprising a matrix of pixel dopings (111, 112, 506, 511, 512).

3. A semiconductor radiation detector device according to claim 1, wherein said modified internal gate layer (104) is an implantation layer made to the material of the bulk layer (103), and said barrier layer (105) is an epitaxial layer epitaxially grown on top of said modified internal gate layer (104).

4. A semiconductor radiation detector device according to claim 3, wherein said pixel dopings (111, 112, 506, 511, 512) comprise areas of said epitaxial layer (105) implanted with a dopant making said pixel dopings (111, 112) exhibit conductivity of the second type.

5. A semiconductor radiation detector device according to claim 1, wherein a number of pixel dopings (111, 112, 506, 511, 512) comprise a pixel-specific transistor built on the pixel doping, said transistor being a field effect transistor or bipolar transistor, and the semiconductor radiation detector device comprises a signal charge reader circuit adapted to measure electric characteristics of pixel-specific transistors related to effective channel or base dimensions of the pixel-specific transistors.

6. A semiconductor radiation detector device according to claim 5, wherein said signal charge reader circuit is adapted to measure electric characteristics of a pixel-specific transistor related to decreasing channel or base width caused by radiation-induced holes or electrons accumulating in the modified internal gate layer at a location coincident with a pixel containing said pixel-specific transistor.

7. A semiconductor radiation detector device according to claim 5, wherein said signal charge reader circuit is adapted to measure electric characteristics of a pixel-specific transistor related to increasing channel or base width caused by radiation-induced electrons or holes accumulating in the modified internal gate layer at a location coincident with a pixel containing said pixel-specific transistor.

8. A semiconductor radiation detector device according to claim 5, where the source of a FET or the emitter of a bipolar transistor are floating.

9. A semiconductor radiation detector device according to claim 5, where the floating source of a FET or the floating emitter of a bipolar transistor is connected to a capacitor.

10. A semiconductor radiation detector device according to claim 1, comprising:
an active area at a part of a semiconductor chip, which active area comprises said pixel dopings (111, 112, 506, 511, 512), and
a front side contact (821, 825, 1030, 1210) for bringing a bias voltage to the semiconductor radiation detector device, said front side contact (821, 825, 1030, 1210) being at a location between said active area and an edge of said semiconductor chip.

11. A semiconductor radiation detector device according to claim 10, wherein said front side contact (821, 825) comprises a trench structure reaching to the bulk layer (103).

12. A semiconductor radiation detector device according to claim 11, comprising a number of separate trench structures (822, 823, 824) between said front side contact (821) and said active area.

13. A semiconductor radiation detector device according to claim 1, comprising channel stop dopings (115, 116, 515, 516) between pixels, said channel stop dopings (115, 116, 515, 516) being adapted to be floating or biased.

14. A semiconductor radiation detector device according to claim 1, comprising floating or biased MOS structures between pixels.

15. A semiconductor radiation detector device according to claim 1, comprising:
an active area at a part of a semiconductor chip, which active area comprises said pixel dopings (111, 112, 506, 511, 512), and
a backside contact to the backside layer (102) for bringing a bias voltage to the semiconductor radiation detector device, said backside contact being at a location between said active area and an edge of said semiconductor chip.

16. A semiconductor radiation detector device according to claim 15, wherein said channel stop dopings (115, 116, 515, 516) are of the first conductivity type, thus exhibiting the opposite type of conductivity compared to the pixels.

17. A semiconductor radiation detector device according to claim 1, comprising a buckling (1510, 1710, 1810, 3010, 3210, 3310) of a pixel doping or an implant inside a pixel doping, said buckling extending the dimension of said pixel doping or implant towards said modified internal gate layer (104).

18. A semiconductor radiation detector device according to claim 1, comprising a local enhancement (1504) of the modified internal gate layer (104) doping.

19. A semiconductor radiation detector device according to claim 1, comprising an alteration of the barrier layer (105) doping.

20. A semiconductor radiation detector device according to claim 1, comprising floating or biased additional dopings (811, 814, 815, 819, 1020, 1115) of first or second or both types of conductivity outside an active area that comprises a matrix of pixel dopings (111, 112, 506, 511, 512).

21. A semiconductor radiation detector device according to claim 20, comprising read and selection electronics on said additional dopings (811, 814, 815, 819, 1020, 1115).

22. A semiconductor radiation detector device according to claim 1, comprising layers (104, 105) made by implantation.

23. A semiconductor radiation detector device according to claim 1, comprising layer (506) made by implantation.

24. A semiconductor radiation detector device according to claim 22 or 23 or both, where the implantation are maskless blank implantations.

25. A method for detecting radiation, comprising:
coupling a number of pixels (111, 511) on a surface of a semiconductor radiation detector device to a pixel voltage,
illuminating said semiconductor radiation detector with radiation, characterised in that it comprises:
collecting radiation-induced signal charges of first kind from a bulk layer (103) of said semiconductor radiation detector to local minima of a three-dimensional potential function for said charges of first kind, said local minima being locationally coincident with pixels (111) in a modified internal gate layer (104) situated next to said bulk layer (103), and
detecting the amount of signal charge collected to local minima that coincide with pixels (111).

26. A method according to claim 25, wherein detecting the amount of signal charge comprises observing the electric characteristics of pixel-specific transistors related to effective channel or base dimensions of the pixel-specific transistors.

27. A method according to claim 25, wherein detecting the amount of signal charge comprises transferring pixel-related charge across a number of pixels to a readout pixel, and observing the electric characteristics of said readout pixel.

* * * * *